(12) United States Patent
Siebrits et al.

(10) Patent No.: US 7,509,245 B2
(45) Date of Patent: *Mar. 24, 2009

(54) METHOD SYSTEM AND PROGRAM STORAGE DEVICE FOR SIMULATING A MULTILAYER RESERVOIR AND PARTIALLY ACTIVE ELEMENTS IN A HYDRAULIC FRACTURING SIMULATOR

(75) Inventors: Eduard Siebrits, Stafford, TX (US); Anthony Peirce, Vancouver (CA)

(73) Assignee: Schlumberger Technology Corporation, Sugar Land, TX (US)

( * ) Notice: Subject to any disclaimer, the term of this patent is extended or adjusted under 35 U.S.C. 154(b) by 406 days.

This patent is subject to a terminal disclaimer.

(21) Appl. No.: 11/095,104

(22) Filed: Mar. 31, 2005

(65) Prior Publication Data

US 2005/0171751 A1 Aug. 4, 2005

Related U.S. Application Data

(63) Continuation-in-part of application No. 10/831,799, filed on Apr. 26, 2004, now Pat. No. 7,063,147, and a continuation-in-part of application No. 09/301,961, filed on Apr. 29, 1999, now Pat. No. 6,876,959.

(51) Int. Cl.
*G06G 7/48* (2006.01)

(52) U.S. Cl. ............ 703/10; 703/2; 703/6; 703/9; 702/1; 702/2; 702/6; 702/11; 702/12

(58) Field of Classification Search ............ 703/10, 703/2, 6, 9; 166/250.1, 308.1; 702/1, 2, 702/6, 11, 12

See application file for complete search history.

(56) References Cited

U.S. PATENT DOCUMENTS

| | | | | | |
|---|---|---|---|---|---|
| 5,310,003 | A | * | 5/1994 | Jennings | 166/307 |
| 5,442,173 | A | * | 8/1995 | Wraight | 250/260 |
| 5,771,170 | A | * | 6/1998 | Withers et al. | 702/16 |
| 6,052,520 | A | * | 4/2000 | Watts, III | 703/10 |
| 6,094,619 | A | * | 7/2000 | Noetinger et al. | 702/12 |
| 6,106,561 | A | * | 8/2000 | Farmer | 703/10 |

(Continued)

OTHER PUBLICATIONS

A. Peirce, and E. Siebrits, "Stability Analysis and Design of Time-Stepping Schemes for General Elastodynamic Boundary Element Models", International Journal for Numerical Methods in Engineering, vol. 40, pp. 319-342, 1997.*

(Continued)

*Primary Examiner*—Kamini S Shah
*Assistant Examiner*—Kibrom K Gebresilassie
(74) *Attorney, Agent, or Firm*—David Cate; Darla Fonseca; Robin Nava

(57) ABSTRACT

A method, practiced by a Hydraulic Fracturing Simulator software, is adapted for simulating a hydraulic fracture in an Earth formation, the formation including a multilayered reservoir, a mesh adapted to overlay the fracture in the formation thereby defining a plurality of elements, the mesh and the fracture defining one or more partially active elements, the method comprising the step of: setting up an Influence Coefficient Matrix, the matrix having a plurality of numbers, the plurality of numbers of the Influence Coefficient Matrix being calculated and determined such that the method, practiced by the Hydraulic Fracturing Simulator software for simulating the hydraulic fracture, models, or take into account an existence of, the multilayered reservoir and the partially active elements.

10 Claims, 18 Drawing Sheets

U.S. PATENT DOCUMENTS

| | | | |
|---|---|---|---|
| 6,192,316 B1* | 2/2001 | Hornby | 702/6 |
| 6,216,786 B1* | 4/2001 | Griffin et al. | 166/308.1 |
| 6,230,101 B1* | 5/2001 | Wallis | 702/16 |
| 6,662,146 B1* | 12/2003 | Watts | 703/10 |
| 6,674,432 B2* | 1/2004 | Kennon et al. | 345/419 |
| 6,810,370 B1* | 10/2004 | Watts, III | 703/10 |
| 6,826,483 B1* | 11/2004 | Anderson et al. | 702/13 |
| 6,826,520 B1* | 11/2004 | Khan et al. | 703/10 |
| 6,834,233 B2* | 12/2004 | Economides et al. | 702/1 |
| 6,842,725 B1* | 1/2005 | Sarda | 703/10 |
| 6,876,959 B1* | 4/2005 | Peirce et al. | 703/10 |
| 6,883,153 B2* | 4/2005 | Jiang et al. | 716/6 |
| 6,938,693 B2* | 9/2005 | Boney et al. | 166/280.1 |
| 7,006,918 B2* | 2/2006 | Economides et al. | 702/1 |
| 7,006,959 B1* | 2/2006 | Huh et al. | 703/10 |
| 7,024,342 B1* | 4/2006 | Waite et al. | 703/6 |
| 7,096,122 B2* | 8/2006 | Han | 702/13 |
| 7,260,508 B2* | 8/2007 | Lim et al. | 703/2 |
| 7,386,431 B2* | 6/2008 | Siebrits et al. | 703/10 |
| 2002/0032494 A1* | 3/2002 | Kennon et al. | 700/98 |
| 2002/0091502 A1* | 7/2002 | Malthe-Sorenssen et al. | 703/2 |
| 2004/0016541 A1* | 1/2004 | Detournay et al. | 166/250.1 |
| 2004/0254730 A1* | 12/2004 | Najmuddin | 702/2 |
| 2005/0115711 A1* | 6/2005 | Williams et al. | 166/308.1 |
| 2005/0222852 A1* | 10/2005 | Craig | 705/1 |

OTHER PUBLICATIONS

A. Peirce, E. Siebrits, "Stability Analysis and Design of Time-Stepping Schemes for General Elastodynamic Boundary elements Models,", International Journal for Numerical Method in Engineering, vol. 40, 319-342, 1997.*

Gohfer *Grid Oriented Hydraulic Fracture Extension Replicator*, p. 1-52, Appendix, p. 1-11, (1996) by Stim-Lab, Inc. and Marathon Oil Company.

Cade Office, *Solution Revolution Break Open Your Reserves with FracCADE*, p. 1-6, (Jan. 1998), Schlumberger Oilfield Services, Dowell, GeoQuest.

J. A. Ryder and J. A. L. Napier, *Error Analysis and Design of a Large-Scale Tabular Mining Stress Analyser*, (1985) Chamber of Mines of South Africa Research Organization.

D. A. Mendelsohn, *A Review of Hydraulic Fracture Modeling—Part I: General Concepts, 2D Models, Motivation for 3D Modeling*, p. 369-376, (Sep. 1984), Journal of Energy Resources Technology.

L. J. Wardle, *Stress Analysis of Multilayered Anisotropic Elastic Systems Subject to Rectangular Loads*, p. 1-37, (1980), CSIRO.

Sarva Jit Singh, *Static Deformation of Transversely Isotropic Multilayered Half-Space by Surface Loads*, p. 263-273, (1986), Physics of the Earth and Planetary Interiors, 42.

Sarva Jit Singh, *Static Deformation of a Multilayered Half-Space by Internal Sources*, p. 3257-3263. (Jun. 10, 1970), Journal of Geophysical Research.

Ryosuke Sato and Mitsuhiro Matsu'Ural, *Static Deformations Due to the Fault Spreading over Several Layers in a Multi-Layered Medium Part I: Displacement*, p. 227-249, (Sep. 20, 1973), J. Phys. Earth, 21.

Ernian Pan, *Static Green's Functions in MultiLayered HalfSpaces*, p. 509-521, (1997), Appl. Math. Modeling, vol. 21.

Ernian Pan, *Static Response of a Transversley Isotropic and Layered Half-Space to General Dislocation Sources*, p. 103-115, (1989), Physics of the Earth and Planetary Interiors, 58.

A. A. Linkova and A. A. Savitski, *An Effective Method for Multi-Layered Media with Cracks and Cavities*, p. 338-355, (1994) International Journal of Damage Mechanics, vol. 3.

Dushan B. Jovanovic, Moujahed I. Husseini and Michael A. Chinnery, *Elastic Dislocations in a Layered Half-Space—I. Basics Theory and Numerical Methods*, p. 205-217, (1974), Geophys. J. R. astr. Soc. 39.

Raymond Crampagne, Majid Ahmadpanah, and Jean-Louis Guiraud, *A Simple Method for Determining the Green's Function for a Large Class of MIC Lines Having Multilayered Dielectric Structures*, p. 82-87 (1978) IEEE.

Y. Leonard Chow, Jian Jun Yang, and Gregory E. Howard, *Complex Images for Electrostatic Field Computation in Multilayered Media*, p. 1120-1125, (1991) IEEE.

W. T. Chen, *Computation of Stresses and Displacements in a Layered Elastic Medium*, p. 775-800 (1971) Int. J. Engng Sci. vol. 9.

J.A. Ryder, *Optimal iteration schemes suitable for general nonlinear boundary element modeling applications*, pp. 1079-1084, (1991), Rock Engineering Division, COMRO, South Africa.

Ben-Menahem, A. and Singh, S.J. 1968. Multipolar Elastic Fields In A Layered Half Space, Bull. Seism. Soc. Am. 58(5). 1, 519-72.

Singh, S.J. 1970. Static Deformation Of A Multi-Layered Half-Space By Internal Sources. J. Geophys. Res. 75(17). 3, 257-63.

Chen. W.T. 1971. Computation Of Stresses And Displacements In A Layered Elastic Medium. Int. J. Engng Sci. vol. 9. 775-800.

Sato, R. and Matsu'ura, M. 1973. Static Deformations Due To The Fault Spreading Over Several Layers In A Multi-Layered Medium Part I: Displacement. J.Phys. Earth. 21.

Jovanovich, D.B. Husseini, M.I. and Chinnery, M.A. 1974. Elastic Dislocations In A Layered Half-Space—I. Basic Theory And Numerical Methods. Geophys. J.R., Astro. Soc. 39.205-217.

Wardle, L.J. 1980. Stress Analysis Of Multilayered Anisotropic Elastic Systems Subject To Rectangular Loads, CSIRO Aust. Div. Appl. Geomech. Tech. paper No. 33. 1-37.

Singh, S.J. 1986. Static Deformations Of A Transversely Isotropic Multilayered Half-Space By Surface Loads. Physics of the Earth and Planetary Interiors. 42. 263-273.

Pan, E. 1989, Static Response Of A Transversely Isotropic And Layered Half-Space To General Surface Lodas. Physic of the Earth and Planetary Interiors. 54. 353-363.

Pan, E. 1989. Static Response Of A Transverseley Istropic And Layered Half-Space To General Dislocation Sources. Physics of the Earth and Planetary Interiors,58. 103-117.

Pan, E. 1997. Static Green's Functions In Multilayered Half Spaces. Appl. Math. Modeling. 21, 509-521.

Chow, Y.L., Yang, J.J. and Howard, G.E. 1991. Complex Images For Electrostatic Field Computation In Multilayered Media. IEEE Trans. On Microwave Theory and Techniques. vol. 39.No. 7. 1120-25.

Crampagne, R. Ahmadpanah, M and Guiraud, J.L. 1978. A Simple Method For Determining The Green's Function For A Class of MIC Lines Having Multilayered Dielectric Structures. IEEE Trans. On Microwave Theory and Techniques. vol. MTT-26.No. 2. 82-87.

Linkov, A.M., Linkova, A.A. and Savitski, A.A. 1994. An Effective Method For Multi-layered Media With Cracks and Cavities. Int. J. of Damage Mech. 3. 338-35.

Ryder, J.A. and Napier, J.A. L. 1985. Error Analysis and Design Of A Large Scale Tabular Mining Stress Analyzer. Proc: Fifith Int. Conf. On Num. Meth. In Geomech. Nagoya. 1549-1555.

J.A. Ryder, Cairns, E.G. Beer, J.R. Booker, and J.P. Carter, Optimal Iteration Schemes Suitable For General Non-Linear Boundary Element Modeling Applications: Proceedings for the 7th International Conference on Computer Methods and Advances in Geomechanics, Balkema Rotterdam, 1991.

Salamon M., "Some Application of the Frictionless Laminated Model". Rock Mechanics as a Guide for Efficient Utilization of Natural Resources, Khair (ed.), copyright 1989, Balkema, Rotterdam, ISBN 90 6191 871 5.

Salamon M., "Subsidence Prediction Using a Laminated Linear Model", Rock Mechanics as a Guide for Efficient Utilization of Natural Resources, Khair (ed.), copyright 1989, Balkema Rotterdam, ISBN 90 6191 8715.

Yue, Z. and Yin J., "Backward Transfer-Matrix Method for Elastic Analysis of Layered Solids with Imperfect Bonding", Journal of Elasticity, 50: 109-128, 1998 copyright 1998 Kluwer Academic Publishers.

Dr. Quan Guo, *A Fully Three-Dimensional Hydraulic Fracturing Simulator*, p. 1-14, TerraFrac (Jan. 1, 1995).

FracCade Software, p. 1-4, Schlumberger Dowell, (Jan. 1, 1995).

R.J. Clifton, Three-Dimensional Fracture-Propagation Models, p. 95-108, Brown U. and Terra Tek Inc. (Jan. 1, 1989).

* cited by examiner

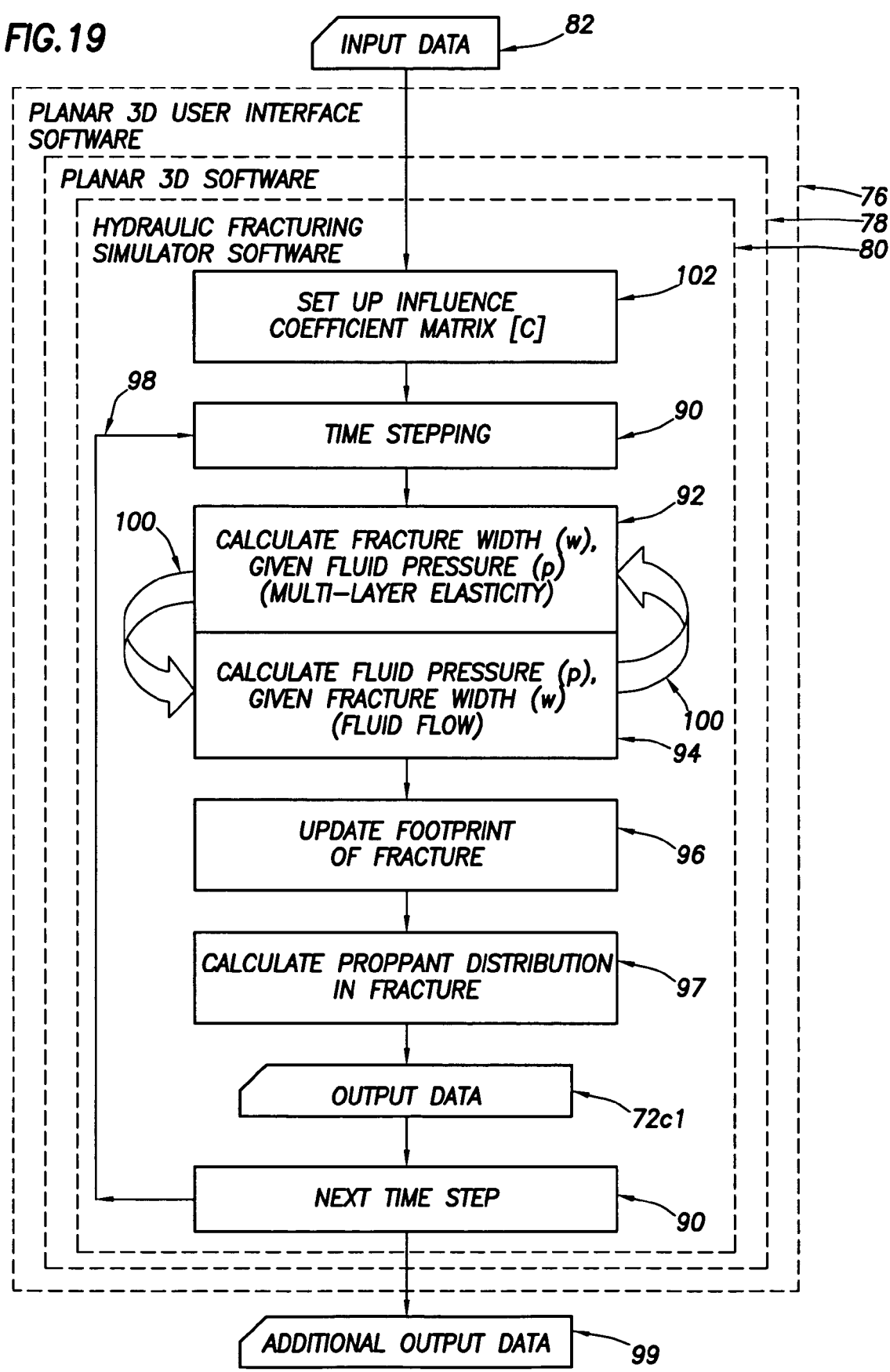

- IN ORDER TO OBTAIN THE STRESS AND DISPLACEMENTS DUE TO A PRESCRIBED SOURCE (eg DISPLACEMENT DISCONTINUITY (DD) ELEMENT) DETERMINE THE SPECTRAL COEFFICIENTS $A_j^l(k)$ BY SOLVING A SYSTEM OF ALGEBRAIC EQUATIONS (7) AND (9) THAT EXPRESS THE CONTINUITY OF TRACTIONS AND DISPLACEMENTS ACROSS LAYER INTERFACES.

- DETERMINE THE (FREE SPACE) SPECTRAL COEFFICIENTS $A_j^l(\infty)$ BY SOLVING (7) AND (9) FOR AN INFINITE HOMOGENEOUS MEDIUM CORRESPONDING TO THE HIGH FREQUENCY COMPONENTS ASSOCIATED WITH THE PRESCRIBED DD. THE EXPLICIT EXPRESSIONS ARE GIVEN BELOW:

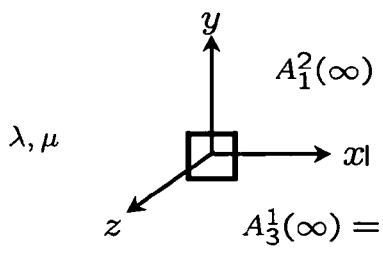

- EVALUATE THE LOW FREQUENCY SPECTRAL COMPONENTS DEFINED BY $$(A_j^l(k))^{LOW} = A_j^l(k) - A_j^l(\infty)$$

- APPROXIMATE THESE LOW FREQUENCY COMPONENTS $(A_j^l(k))^{LOW}$ BY A SERIES OF EXPONENTIAL FUNCTIONS BY SOLVING FOR THE UNKNOWN CONSTANTS $a_{jr}^l$ AND $b_{jr}^l$ IN THE FOLLOWING EXPRESSION:

$$(A_j^l(k))^{LOW} \approx \sum_r a_{jr}^l e^{b_{jr}^l k}$$

- SUBSTITUTE THESE EXPANSIONS FOR THE LOW FREQUENCY COMPONENTS INTO (7) AND (9) TO OBTAIN THE FOLLOWING EXPRESSIONS FOR THE DISPLACEMENT AND STRESS COMPONENTS:

$$\hat{u}_p^l(k,y) = \sum_j s_{jp} \sum_r a_{jr}^l e^{(\alpha_j^l y + b_{jr}^l)k} \quad \text{AND} \quad \hat{\sigma}_{pq}^l(k,y) = \sum_j s_{jpq} \sum_r a_{jr}^l e^{(\alpha_j^l y + b_{jr}^l)k}$$

- INVERT THE DISPLACEMENTS AND STRESSES ASSOCIATED WITH THE LOW FREQUENCY FOURIER TRANSFORMS BY EVALUATING INTEGRALS OF THE FORM:

$$I_j^{pl} \simeq \frac{1}{(2\pi)^2} \sum_r a_{jr}^l \int_{-\infty}^{\infty} \int_{-\infty}^{\infty} e^{-i(mx+nz)} k^p e^{k(\alpha_j^l y + b_{jr}^l)} \, dm \, dn$$

- COMBINE THE LOW FREQUENCY DISPLACEMENT AND STRESS COMPONENTS WITH THE INFINITE SPACE DISPLACEMENTS AND STRESSES AS FOLLOWS:

$$u_i^l = (u_i^l)^{LOW} + (u_i^l)^{\infty} \quad \text{and} \quad \sigma_{ij}^l = (\sigma_{ij}^l)^{LOW} + (\sigma_{ij}^l)^{\infty}$$

FIG.24

METHOD SYSTEM AND PROGRAM STORAGE DEVICE FOR SIMULATING A MULTILAYER RESERVOIR AND PARTIALLY ACTIVE ELEMENTS IN A HYDRAULIC FRACTURING SIMULATOR

CROSS REFERENCE TO RELATED APPLICATIONS

This application is a Continuation in Part of prior application Ser. No. 09/301,961, filed Apr. 29, 1999, now U.S. Pat. No. 6,876,959 entitled "Method and Apparatus for Hydraulic Fracturing Analysis and Design"; this application is also a Continuation in Part of prior application Ser. No. 10/831,799, filed Apr. 26, 2004, now U.S. Pat. No. 7,063,147 entitled "Method and Apparatus and Program Storage Device for Front Tracking in Hydraulic Fracturing Simulators". This application is related to a application Ser. No. 11/096,047, filed Mar. 31, 2005, now U.S. Pat. No. 7,386,431 entitled "Method System and Program Storage Device for Simulating Interfacial Slip In a Hydraulic Fracturing Simulator Software," having the same inventors and the same assignee as the present invention.

BACKGROUND

The subject matter set forth in this specification relates to a Hydraulic Fracturing Simulator Software adapted for designing and monitoring and evaluating reservoir, for example petroleum reservoir, fracturing, and, in particular, to a Hydraulic Fracturing Simulator Software adapted for simulating a multilayer reservoir and partially active elements of a mesh overlaying a fracture footprint when designing and monitoring and evaluating reservoir fracturing.

In hydraulic fracturing, thousands of gallons of fluid are forced under high pressure underground to split open the rock in a subterranean formation, a process which, for petroleum reservoirs, is known as 'petroleum reservoir fracturing' associated with 'a fracturing event'. Proppant or propping agent is carried into the fracture by a viscosified fluid, and deposited into the fracture. Proppant provides a permeable flow channel for formation fluids, such as oil and gas, to travel up the wellbore and to the Earth's surface. Fracturing involves many variables, including: viscosity of the fracturing fluid, rate of leak-off of fracturing fluid into the reservoir, proppant carrying capacity of the fluid, viscosity of the fluid as a function of temperature, time history of fluid volumes (i.e., the amount of fluid pumped over a given period of time), time history of proppant volumes, fluid physical constants, proppant properties, and the geological properties of various zones in the reservoir.

A Hydraulic Fracturing Simulator software is capable of modeling the 'fracturing event'. In fact, the Hydraulic Fracturing Simulator software will design and monitor and evaluate the 'petroleum reservoir fracturing' associated with the 'fracturing event' from a time extending before, during, and after the 'fracturing event'. However, when the Hydraulic Fracturing Simulator software designs and monitors and evaluates the 'petroleum reservoir fracturing' associated with the 'fracturing event', the Hydraulic Fracturing Simulator software should function to model a 'multilayered reservoir' when modeling the 'fracturing event'. In addition, the Hydraulic Fracturing Simulator software should also function to model 'partially active elements' (partially enclosed by the fracture footprint, as opposed to 'fully active elements' fully enclosed by the fracture footprint), among a plurality of elements of a mesh overlaying a fracture footprint, when the Hydraulic Fracturing Simulator software models the 'fracturing event'.

Therefore, a Hydraulic Fracturing Simulator Software is needed that is capable of modeling or simulating a 'multilayered reservoir' during a time when the Hydraulic Fracturing Simulator Software is designing and monitoring and evaluating 'petroleum reservoir fracturing' associated with the 'fracturing event'.

In addition, a Hydraulic Fracturing Simulator Software is needed that is capable of modeling or simulating 'partially active elements', among a plurality of elements of a mesh overlaying a fracture footprint, during a time when the Hydraulic Fracturing Simulator Software is designing and monitoring and evaluating 'petroleum reservoir fracturing' associated with the 'fracturing event'.

SUMMARY

One aspect of the present invention involves a program storage device readable by a machine tangibly embodying a program of instructions executable by the machine to perform method steps of simulating a hydraulic fracture in an Earth formation where the formation includes a multilayered reservoir, a mesh overlaying the fracture thereby defining a plurality of elements, the method steps comprising: calculating and determining an influence coefficient matrix, the matrix having a plurality of numbers, the plurality of numbers of the influence coefficient matrix being calculated and determined such that the method steps for simulating the hydraulic fracture will take into account an existence of the multilayered reservoir.

Another aspect of the present invention involves a method of simulating a hydraulic fracture in an Earth formation where the formation includes a multilayered reservoir, a mesh overlaying the fracture thereby defining a plurality of elements, comprising the step of: calculating and determining an influence coefficient matrix, the matrix having a plurality of numbers, the plurality of numbers of the influence coefficient matrix being calculated and determined such that the method steps for simulating the hydraulic fracture will take into account an existence of the multilayered reservoir.

Another aspect of the present invention involves a program storage device readable by a machine tangibly embodying a program of instructions executable by the machine to perform method steps of simulating a hydraulic fracture in an Earth formation where a mesh overlays the fracture, the mesh and the fracture collectively defining one or more partially active elements, the method steps comprising: calculating and determining an influence coefficient matrix, the matrix having a plurality of numbers, the plurality of numbers of the influence coefficient matrix being calculated and determined such that the method steps for simulating the hydraulic fracture will take into account an existence of the one or more partially active elements.

Another aspect of the present invention involves a method of simulating a hydraulic fracture in an Earth formation where a mesh overlays the fracture, the mesh and the fracture collectively defining one or more partially active elements, comprising the step of: calculating and determining an influence coefficient matrix, the matrix having a plurality of numbers, the plurality of numbers of the influence coefficient matrix being calculated and determined such that the method steps for simulating the hydraulic fracture will take into account an existence of the one or more partially active elements.

A further aspect of the present invention involves a system adapted for simulating a hydraulic fracture in an Earth formation where the formation includes a multilayered reservoir, a mesh overlaying the fracture thereby defining a plurality of elements, comprising: apparatus adapted for calculating and determining an influence coefficient matrix, the matrix having a plurality of numbers, the plurality of numbers of the influence coefficient matrix being calculated and determined such that the system adapted for simulating the hydraulic fracture in the formation will take into account an existence of the multilayered reservoir.

A further aspect of the present invention involves a system adapted for simulating a hydraulic fracture in an Earth formation where a mesh overlays the fracture, the mesh and the fracture collectively defining one or more partially active elements, comprising: apparatus adapted for calculating and determining an influence coefficient matrix, the matrix having a plurality of numbers, the plurality of numbers of the influence coefficient matrix being calculated and determined such that the system adapted for simulating the hydraulic fracture will take into account an existence of the one or more partially active elements.

Further scope of applicability will become apparent from the detailed description presented hereinafter. It should be understood, however, that the detailed description and the specific examples set forth below are given by way of illustration only, since various changes and modifications within the spirit and scope of the 'Hydraulic Fracturing Simulator Software', as described and claimed in this specification, will become obvious to one skilled in the art from a reading of the following detailed description.

BRIEF DESCRIPTION OF THE DRAWINGS

A full understanding will be obtained from the detailed description presented hereinbelow, and the accompanying drawings, which are given by way of illustration only and are not intended to be limitative to any extent, and wherein:

FIG. 19 illustrates a construction of the 'Hydraulic Fracturing Simulator software' of FIG. 16;

FIGS. 23 and 24 illustrate a construction of the 'Set Up Influence Coefficient Matrix [C]' step 102 of FIGS. 19 and 21.

DESCRIPTION

This specification discloses a Hydraulic Fracturing Simulator software adapted to be stored in a memory of a program storage device of a computer system for modeling and simulating a multilayered reservoir and for modeling and simulating partially active elements of a mesh overlaying a fracture footprint when the Hydraulic Fracturing Simulator software is designing and monitoring and evaluating petroleum reservoir fracturing. The Hydraulic Fracturing Simulator software includes a first step further including the step of Setting Up an Influence Coefficient Matrix and a second step further including two iteration loops whereby, in a first iteration loop at a first time step, a second iteration loop will continuously calculate fracture width for each element of the mesh given a previously determined fluid pressure and will continuously calculate fluid pressure for each element of the mesh given a previously determined fracture width until convergence of the solution of width and pressure is reached at which time the fracture footprint is updated to a first value and 'output data' is generated, then, in the first iteration loop at a second time step, the second iteration loop calculates fracture width for each element of the mesh given a previously determined fluid pressure, and fluid pressure for each element of the mesh is calculated given a previously determined fracture width at which time the fracture footprint is updated to a second value and 'output data' is generated, and the process repeats, at which point, 'additional output data' is generated. The 'output data' includes the previously determined first value of the fracture footprint and the previously determined second value of the fracture footprint. The 'output data', representative of the updated fracture footprint at each of the incremented time steps, is recorded or displayed on a recorder or display device. In the first step including the step of 'setting Up an Influence Coefficient Matrix', the Influence Coefficient Matrix is calculated and determined in a special way such that, when the Influence Coefficient Matrix is determined, and during any 'fracturing event', the Hydraulic Fracturing Simulator software will model and simulate the following: (1) a multilayered reservoir of the type illustrated in FIGS. 13 and 14, and (2) partially active elements of a mesh which overlays a fracture footprint of the type illustrated in FIGS. 10, 11, and 12.

Figure 1:
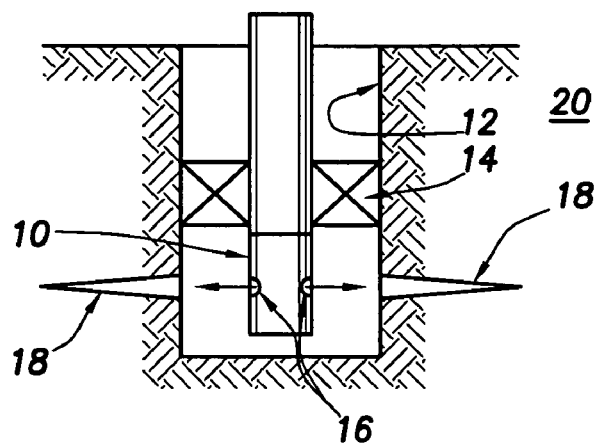
FIGS. 1 through 3 illustrate a typical Hydraulic Fracturing (HF) job in a wellbore.

Referring to FIG. 1, a perforating gun 10 is disposed in a wellbore 12 and a packer 14 isolates a plurality of shaped charges 16 of the perforating gun 10 downhole in relation to the environment uphole. The shaped charges 16 detonate and a corresponding plurality of perforations 18 are produced in a formation 20 penetrated by the wellbore 12.

Figure 2:
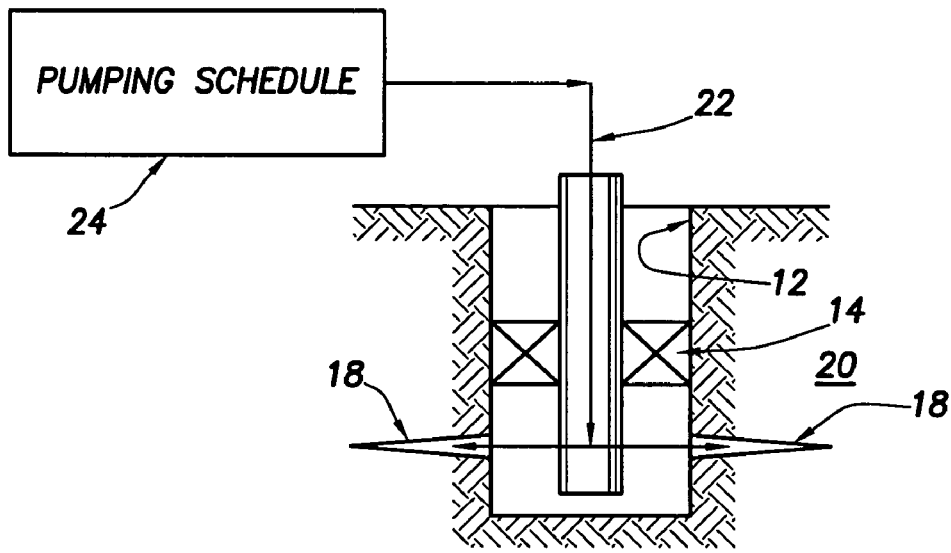

Referring to FIG. 2, when the formation 20 is perforated, a fracturing fluid 22 is pumped downhole into the perforations 18 in accordance with a particular pumping schedule 24. In response thereto, the formation 20 surrounding the perforations 18 is fractured.

Figure 3:
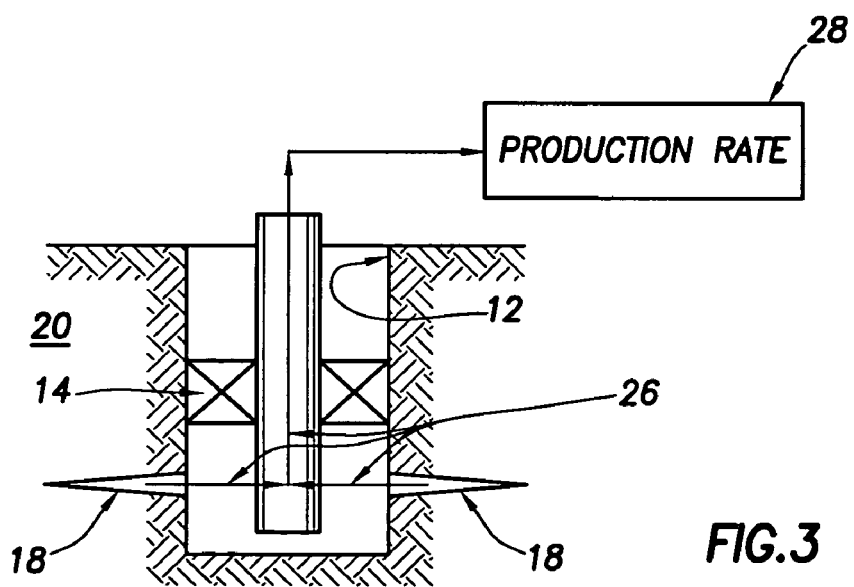

Referring to FIG. 3, when the formation 20 surrounding the perforations 18 is fractured, oil or other hydrocarbon deposits 26 begin to flow from the fractures, into the perforations 18, into the wellbore 12, and uphole to the surface. The oil or other hydrocarbon deposits flow at a certain 'production rate' 28 (e.g., in m$^3$/day).

Figure 4:
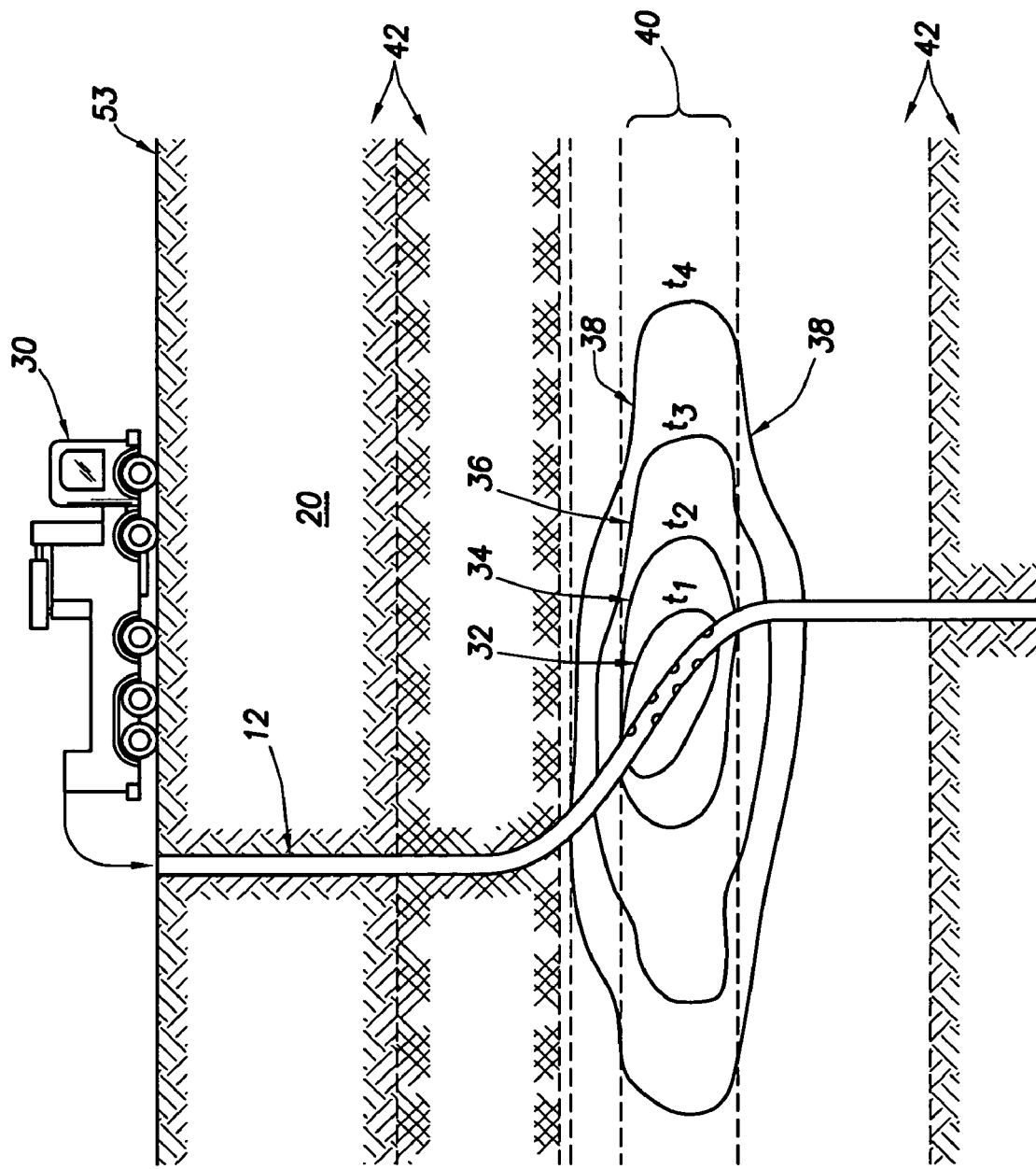
FIGS. 4 through 6 illustrate the fracture footprint created in the formation penetrated by the wellbore when the HF job is pumped.

Referring to FIG. 4, when the wellbore 12 of FIG. 2 is fractured, pump trucks 30 situated at the surface of the wellbore will pump fracturing fluid down a tubing and into the perforations 18 in the formation 20 penetrated by the wellbore, as shown in FIG. 2. The formation 20 includes different layers, such as the different layers 42, one such layer being a perforated interval 40. In response thereto, at time $t_1$, a fracture footprint 32 will be formed in the perforated interval 40 (and possibly in additional adjacent intervals 42) of a formation 20 penetrated by the wellbore 12. At time $t_2$, the fracture footprint 32 will change to a new footprint 34 in the perforated interval 40 (and possibly in additional intervals 42) of a formation 20 penetrated by the wellbore 12. At time $t_3$, the fracture footprint 34 will change to a new footprint 36 in the perforated interval 40 (and possibly in additional intervals 42) of a formation 20 penetrated by the wellbore 12. At time $t_4$, the fracture footprint 36 will change to a new footprint 38 in the perforated interval 40 (and possibly in additional intervals 42) of a formation 20 penetrated by the wellbore 12.

Figure 5:
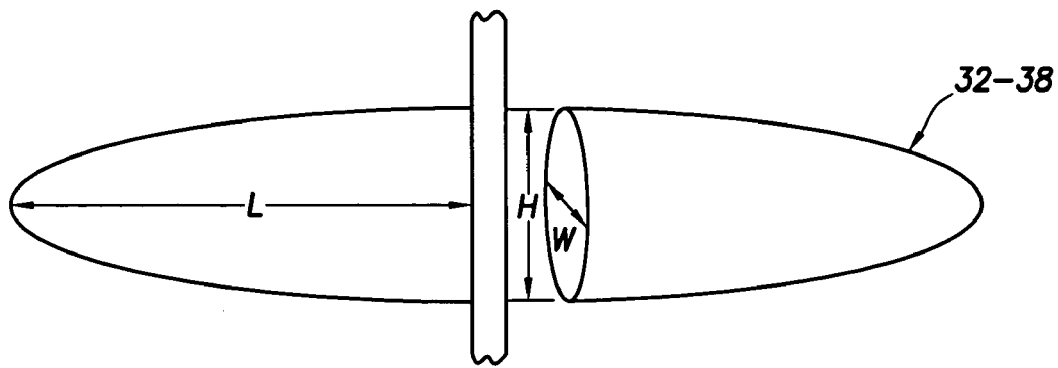
Figure 6:
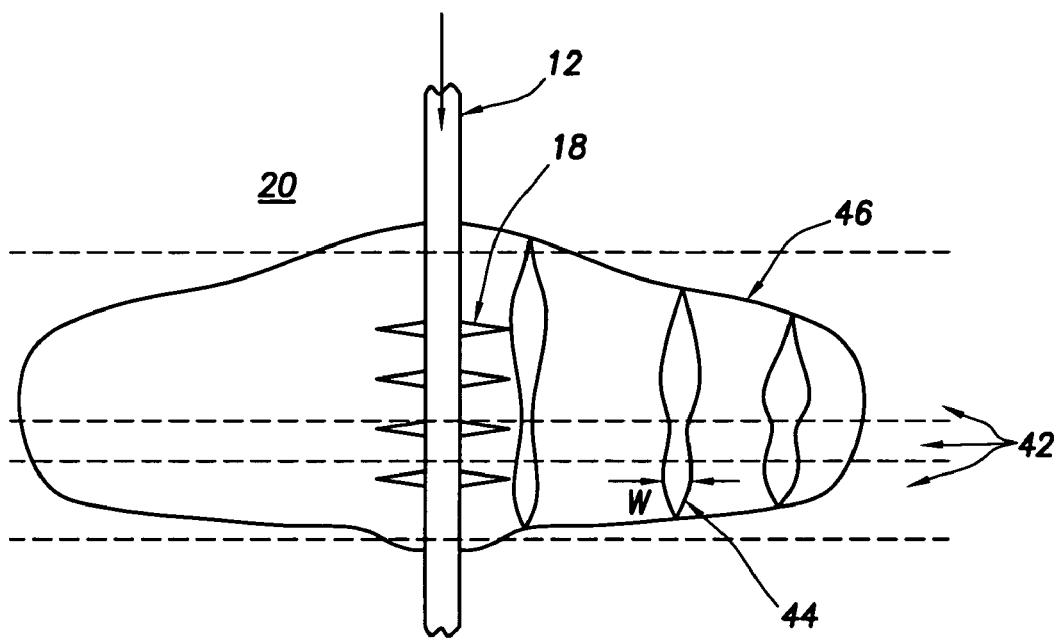

Referring to FIGS. 5 and 6, referring initially to FIG. 5, a schematic three dimensional view of a fracture footprint, such as the fracture footprints 32-38 of FIG. 4, is illustrated. In FIG. 5, each fracture footprint 32-38 has a length 'L' and a height 'H' and a width 'w'. In FIG. 6, the wellbore 12 is illustrated again, and a plurality of perforations 18 are shown in the formation 20 penetrated by the wellbore 12, as illustrated in FIGS. 1-3. As noted in FIG. 4, the formation 20 includes a plurality of different layers 42. In FIG. 6, when the pump trucks 30 of FIG. 4 pump the fracturing fluid into the perforations 18, a 'fracture footprint' 46 is created in the formation 20 which is identical to the fracture footprints 32, 34, 36, and 38 shown in FIG. 4 that are created, respectively, over the different periods of time $t_1$, $t_2$, $t_3$, and $t_4$. Note that the 'fracture footprint' 46 in FIG. 6 has a cross section 44, the cross section 44 having a fracture width 'w' similar to the width 'w' of the fracture footprint 32-38 shown in FIG. 5.

Figure 7:
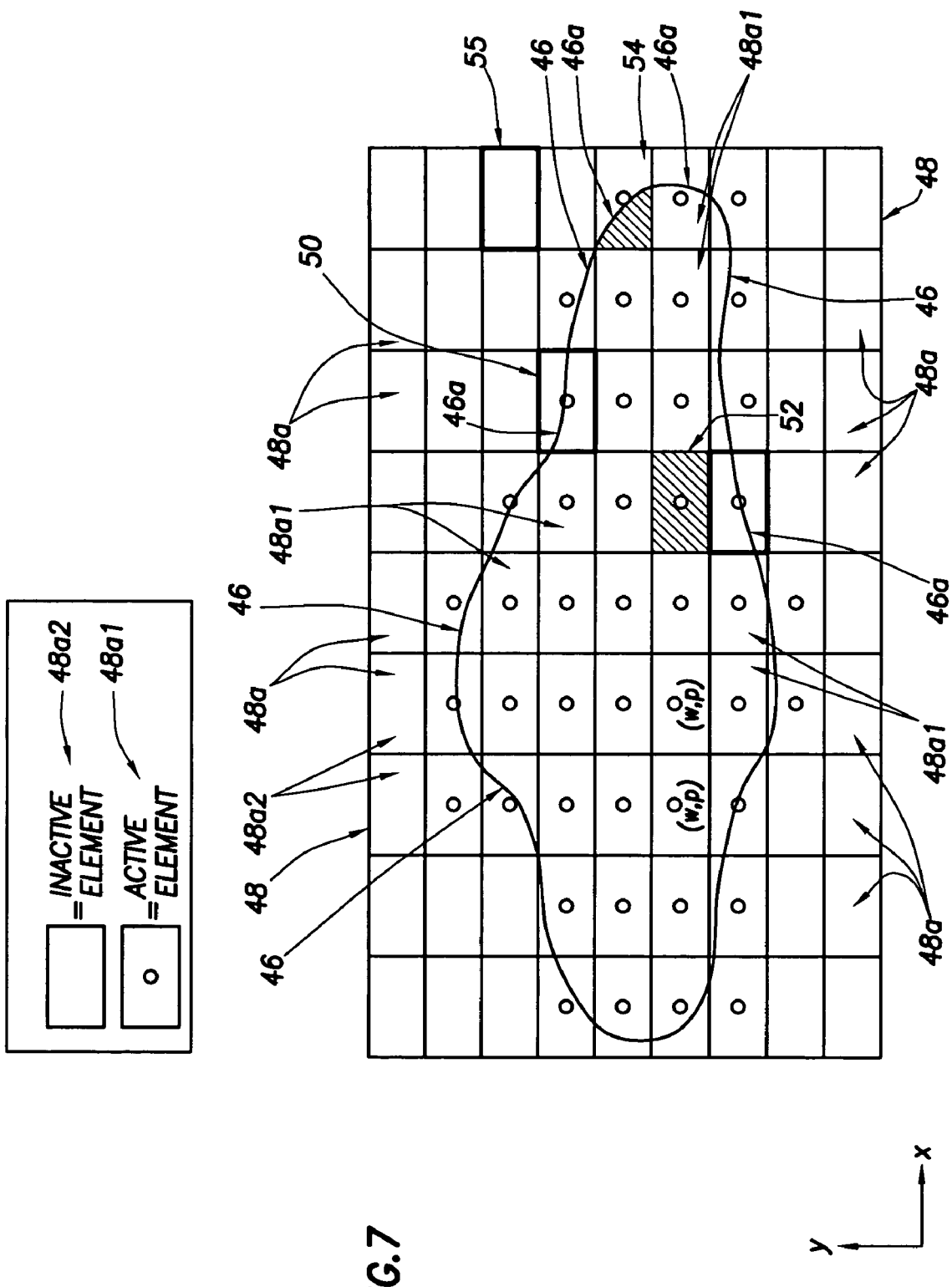
FIGS. 7 through 9 illustrate how a mesh comprised of a plurality of grid cells will overlay on top of the fracture footprint of FIGS. 4 through 6, each grid cell of the mesh having a width and pressure, some of the grids cells called 'tip elements' being intersected by a perimeter of the fracture footprint, the tip elements having a width and a pressure (w, p), a portion of each tip element having fracturing fluid disposed therein.

Referring to FIG. 7, recalling the fracture footprint 46 shown in FIG. 6, in FIG. 7, a mesh 48 comprised of a plurality of grid elements 48$a$ or grid cells 48$a$ is illustrated. The fracture footprint 46 is assumed (by the model of this specification) to lie in the 2D plane, although, in principle and in reality, the fracture footprint 46 does lie in the 3D plane. In FIG. 7, the mesh 48 is overlayed over the top of the fracture footprint 46 of FIG. 6. The mesh 48 includes a plurality of active elements or active grid cells 48$a$1 and a plurality of inactive elements or inactive grid cells 48$a$2. The active grid cells 48$a$1 will overlay the fracture footprint 46, whereas the inactive grid cells 48$a$2 will not overlay the fracture footprint 46. Each of the active grid elements or grid cells 48$a$1 of the mesh 48 has a width 'w' and a pressure 'p' assigned thereto, denoted by the symbol: (w, p). Therefore, each active grid cell 48$a$1 of the mesh 48 has a width/pressure value (w, p) assigned to that active grid cell. In FIG. 6, since the fracturing fluid propagating down the wellbore 12 enters the perforations 18 and creates the fracture footprint 46, in FIG. 7, each of the active grid cells 48$a$1 in the mesh 48 has a fracturing fluid disposed therein. In FIG. 7, there are two types of active grid cells 48$a$1: (1) an active grid cell 48$a$1 which is intersected by a perimeter 46$a$ of the fracture footprint 46, and (2) an active grid cell 48$a$1 which is not intersected by the perimeter 46$a$ of the fracture footprint 46. An active grid cell 48$a$1 that is intersected by the perimeter 46$a$ of the fracture footprint 46 is known as a 'tip element'. For example, in FIG. 7, 'tip element' 50 is an active grid cell 48$a$1 that is intersected by the perimeter 46$a$ of the fracture footprint 46. An active grid cell 48$a$1 which is not intersected by the perimeter 46$a$ of the fracture footprint 46 has a volume which is wholly occupied by the fracturing fluid (i.e., 100% of the volume of the active grid cell is occupied by the fracturing fluid), where the fracturing 'fluid' may or may not include proppant. For example, in FIG. 7, active grid cell 52 is not intersected by the perimeter 46$a$ of the fracture footprint 46 and its volume is wholly occupied by the fracturing fluid (100% of the volume of the active grid cell 52 is occupied by fracturing fluid). However, an active grid cell 48$a$1 that is intersected by the perimeter 46$a$ (i.e., a 'tip element') has a volume that is occupied by 'less than 100%' of the fracturing fluid. For example, the active grid cell or 'tip element' 54 is intersected by the perimeter 46$a$ of the fracture footprint 46, however, only 45% of the volume of the active grid cell 54 is occupied by the fracturing fluid. In comparison, an inactive grid cell 48$a$2, such as inactive grid cell 55, has a volume which is wholly devoid of any fracturing fluid (0% of the volume of the inactive grid cell 55 is occupied by fracturing fluid). In prior pending application Ser. No. 10/831,799, filed Apr. 26, 2004, now U.S. Pat. No. 7,063,147 entitled "Method and Apparatus and Program Storage Device for Front Tracking in Hydraulic Fracturing Simulators" which is directed to the 'VOF software', the 'VOF software' of that prior pending application calculates, over a series of time steps, the 'amount of fracturing fluid that is contained within each of the active grid cells 48$a$1 that are intersected by the perimeter 46$a$ of the fracture footprint 46'. That is, the 'VOF software' of prior pending application Ser. No. 10/831,799 now U.S. Pat. No. 7,063,147 calculates, over the series of time steps, the 'amount of fracturing fluid that is contained within each of the tip elements 50'. The 'amount of fracturing fluid that is contained within each of the tip elements 50' is calculated from the 'fill fraction', the 'fill fraction' being denoted by the letter 'F'. For example, in FIG. 7, the 'fill fraction' F for the 'tip element' 54 is 45%. Therefore, the 'VOF software' of prior pending application Ser. No. 10/831,799 calculates, over a series of time steps, the 'fill fraction' (F) for each of the 'active grid cells 48$a$1 of the mesh 48 that are intersected by the perimeter 46$a$ of the fracture footprint 46'. That is, the 'VOF software' of prior pending application Ser. No. 10/831,799 calculates, over the series of time steps, the 'fill fraction' (F) for each of the 'tip elements' 50 of the mesh 48 of FIG. 7. As a result, by calculating the 'fill fraction' (F) for each of the 'tip elements' 50 over a series of time steps, the amount or degree by which the perimeter 46$a$ of the footprint 46 of the fracture is expanding (or contracting), as a result of the pumping of the fracturing fluid into the perforations 18 in the formation 20 by the pump trucks 30 of FIG. 4, can be determined. The 'VOF software' of prior pending application Ser. No. 10/831,799 now U.S. Pat. No. 7,063,147 is embodied in steps 138 and 96 of FIG. 22. However, in this specification, the 'Generate Elastic Influence Coefficient Matrix for Parent Mesh' step 102 of FIG. 21 (and the 'Set Up Influence Coefficient Matrix [C]' 102 of FIG. 19) is discussed in detail.

Figure 8:
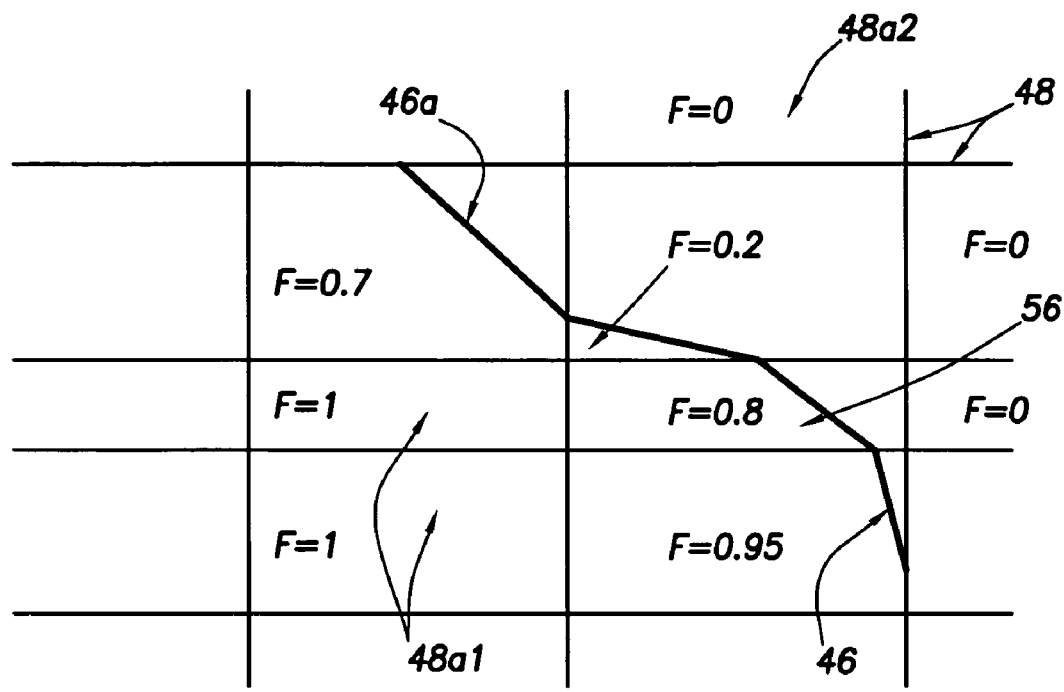
Figure 9:
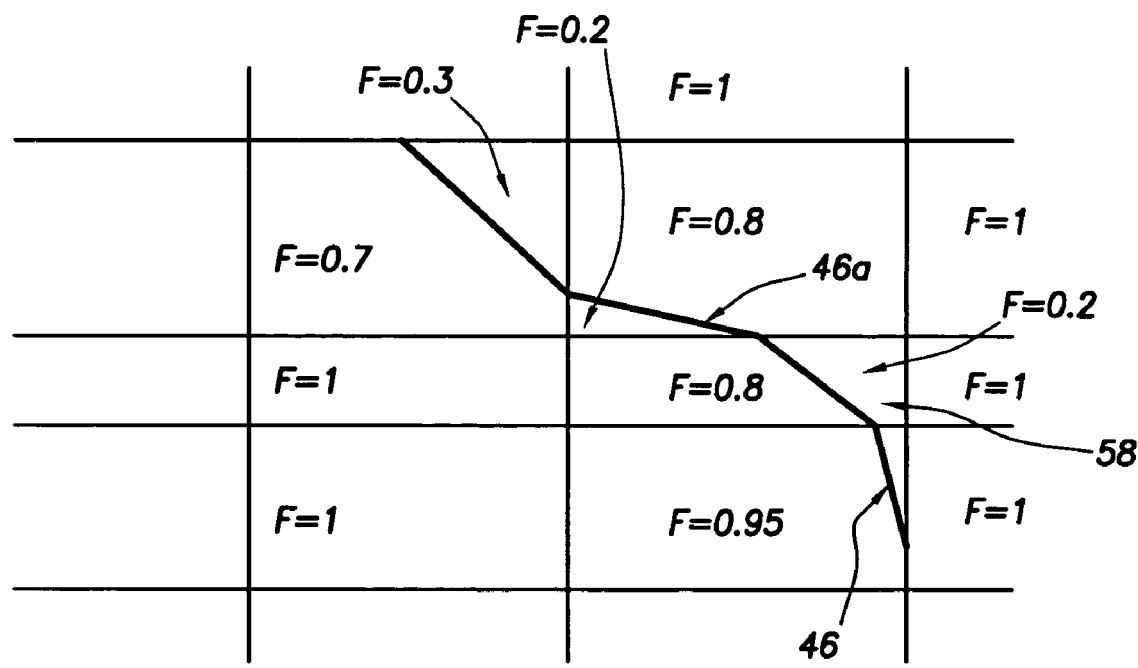

Referring to FIGS. 8 and 9, two more examples of a mesh 48 similar to the mesh 48 of FIG. 7 are illustrated. In FIG. 8, a mesh 48 is illustrated as overlaying the fracture footprint 46 having a perimeter 46a. Fracturing fluid is disposed inside the perimeter 46a, but the fracturing fluid is not disposed outside the perimeter 46a. In FIG. 8, since the inactive grid cell 48a2 is disposed outside the perimeter 46a, there is no fracturing fluid disposed inside the inactive grid cell 48a2 and, therefore, the 'fill fraction' F associated with the inactive grid cell 48a2 of FIG. 8 is 'zero' (F=0). In FIG. 8, the active grid cells 48a1 are disposed wholly within the perimeter 46a (i.e., the perimeter 46a does not intersect the active grid cells 48a1); therefore, the entire volume (i.e., 100%) of the active grid cells 48a1 is occupied by fracturing fluid and, as a result, the 'fill fraction' F associated with the active grid cells 48a1 in FIG. 8 is '1' (F=1). However, in FIG. 8, let us analyze the active grid cell 56. The active grid cell 56 is intersected by the perimeter 46a and, as a result, 80% of the volume of the active grid cell 56 is occupied by the fracturing fluid; therefore, the 'fill fraction' F for the active grid cell 56 is 0.8 (F=0.8). In FIG. 9, the 'VOF software' of prior pending application Ser. No. 10/831,799 also calculates the volume of an active grid cell occupied by a first type of fluid and the volume of that same active grid cell occupied by a second type of fluid. For example, active grid cell 58 includes a first volume of 80% occupied by a first type of fluid, and a second volume of 20% occupied by a second type of fluid. The 'VOF software' of prior pending application Ser. No. 10/831,799 calculates, over a series of time steps, the 'fill fraction' (F) for each of the 'active grid cells 48a1 that are intersected by the perimeter 46a of the fracture footprint 46' in the mesh 48; that is, the 'VOF software' of prior pending application Ser. No. 10/831, 799 will calculate, over the series of time steps, the 'fill fraction' (F) for each of the 'tip elements' in the mesh 48 shown in FIGS. 7, 8, and 9. As a result, the amount or degree by which the perimeter 46a of the footprint 46 is expanding (or contracting), in response to the pumping of fracturing fluid into the perforations 18, can be determined.

Figure 10:
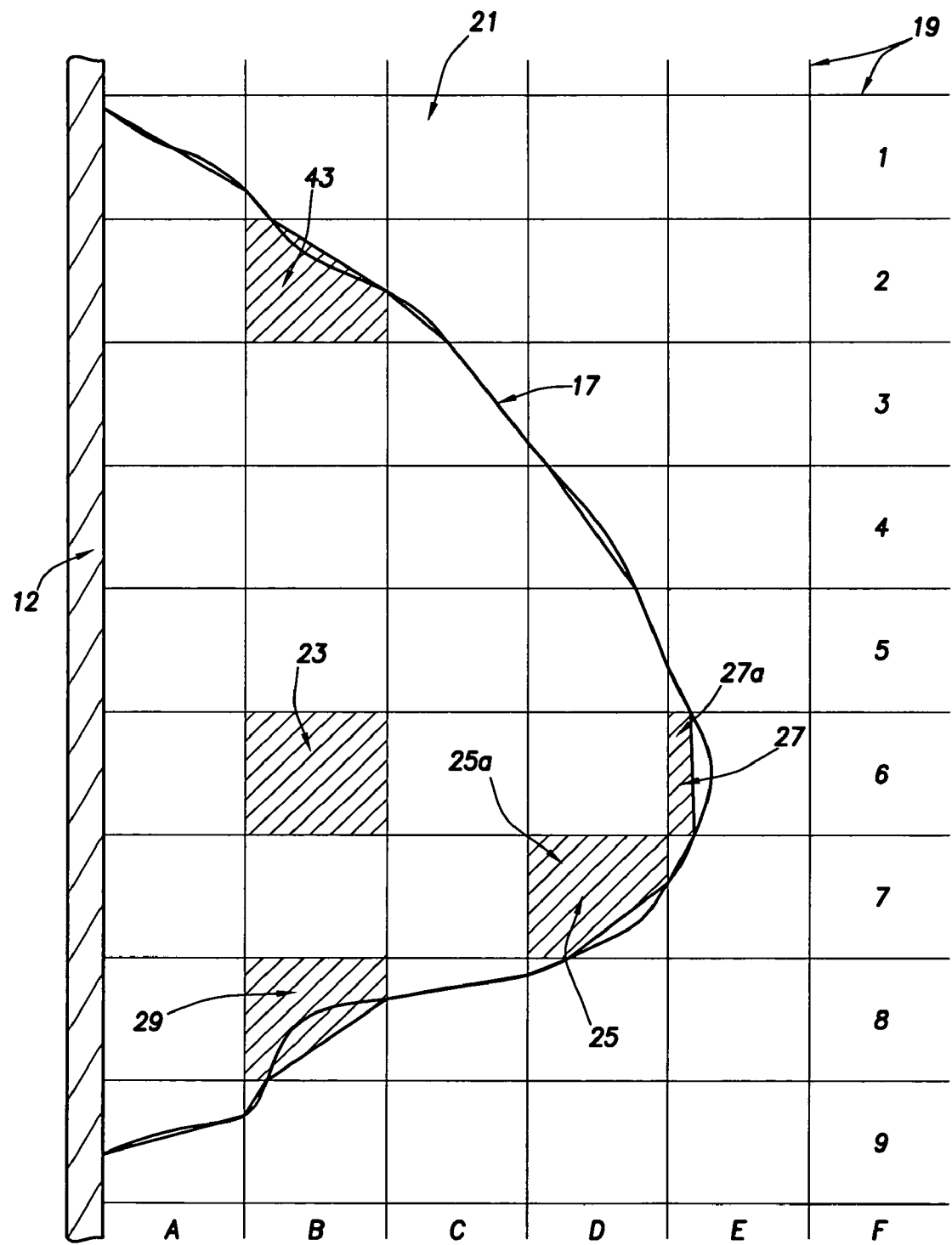
FIG. 10 illustrates a mesh overlayed on top of a fracture footprint, one or more 'fully active elements' being enclosed by the fracture footprint, one or more 'partially active elements' being partially enclosed by the fracture footprint, the Hydraulic Fracturing Simulator software of FIG. 16 modeling the 'partially active elements'.

Referring to FIG. 10, 'fully active elements' and 'inactive elements' and 'partially active elements' are illustrated. In FIG. 10, a wellbore 12 is illustrated, and a fracture 17 grows in a direction that is directed away from the wellbore 12. A mesh 19 overlays the fracture 17. In the mesh 19, an 'inactive element' 21 is illustrated, and a 'fully active element' 23 is also illustrated. Note that FIG. 10 relates to 'fracture growth' of the fracture 17 where the 'growth' of the fracture is in a direction that is either directed away from the wellbore 12 (i.e., expansion) or is directed toward the wellbore 12 (contraction). That is, the fracture 17 represents a moving boundary that is growing in a direction which is either directed away from the wellbore 12 (expansion) or is directed toward the wellbore 12 (contraction). In FIG. 10, 'partially active elements' 25 and 27 and 29 and 43 are illustrated. In the 'partially active element' 25 and 27, only a portion 25a and 27a of the 'partially active element' 25 and 27 is disposed inside of the boundary 17 of the fracture 17. Since only portions 25a and 27a of 'partially active elements' 25 and 27 are disposed inside the boundary 17 of fracture 17, the elements 25 and 27 of mesh 19 of FIG. 10 are each known as a 'partially active element'.

Figure 11:
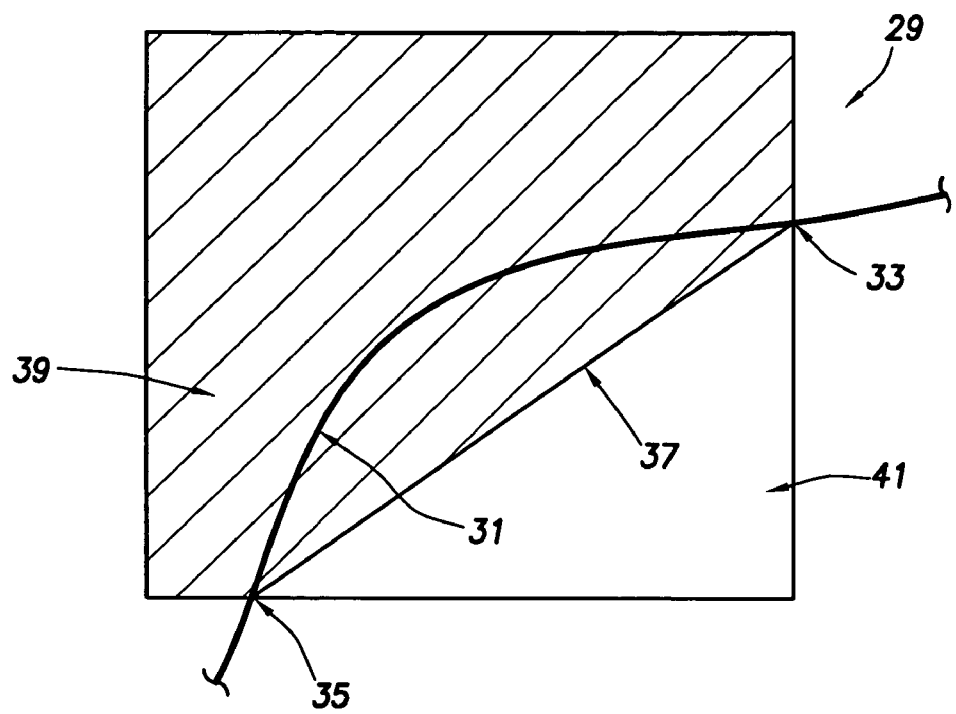
FIGS. 11 and 12 illustrate, in greater detail, the 'partially active elements' of FIG. 10, the Hydraulic Fracturing Simulator software of FIG. 16 modeling the 'partially active elements'.

FIG. 11 illustrates a close up view of the 'partially active element' 29 of FIG. 10. The 'partially active element' 29 has a fracture leading edge 31 with crossing points 33 and 35, respectively. Straight line 37 is erected between the crossing points, and it forms the boundary for the active portion 39 of the element 29 and the inactive portion 41 of the element 29.

Figure 12:
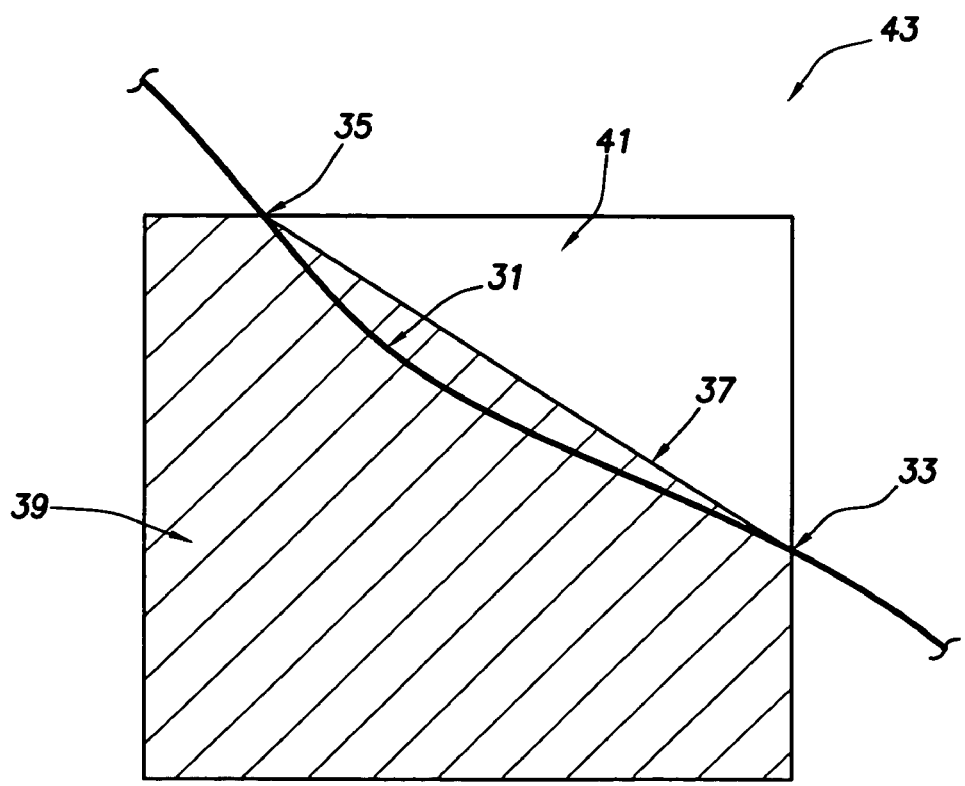

FIG. 12 illustrates the same features for the 'partially active element' 43 of FIG. 10 as did FIG. 11 with respect to the 'partially active element' 29 of FIG. 10. In FIG. 12, a 'partially active element' 43 has a fracture leading edge 31 with crossing points 33 and 35, respectively. Straight line 37 is erected between the crossing points 33, 35, and it forms the boundary for the active portion 39 of the element 43 and the inactive portion 41 of the element 43.

The concept of 'partially active elements', such as the 'partially active elements' 25, 27, 29, and 43 shown in FIGS. 10, 11, and 12, is set forth in the following two publications, each of which is incorporated herein by reference: (1) Ryder, J. A. and Napier, J. A. L., 1985, *Error Analysis and Design of a Large Scale Tabular Mining Stress Analyzer*, Proceedings of the Fifth International Conference on Numerical Methods in Geomechanics, Nagoya, Japan, [Balkema] 1549-1555, the disclosure of which is incorporated by reference into the specification of this application; and (2) Ryder, J. A., Eds.: E. G., Beer, J. R. Booker, and J. P. Carter, *Optimal Iteration Schemes Suitable for General Non-linear Boundary Element Modeling Applications*: Proceedings of the 7th International Conference on Computer Methods and Advances in Geomechanics, Cairns, Australia, [Balkema], 1991, the disclosure of which is incorporated by reference into the specification of this application.

Figure 13:
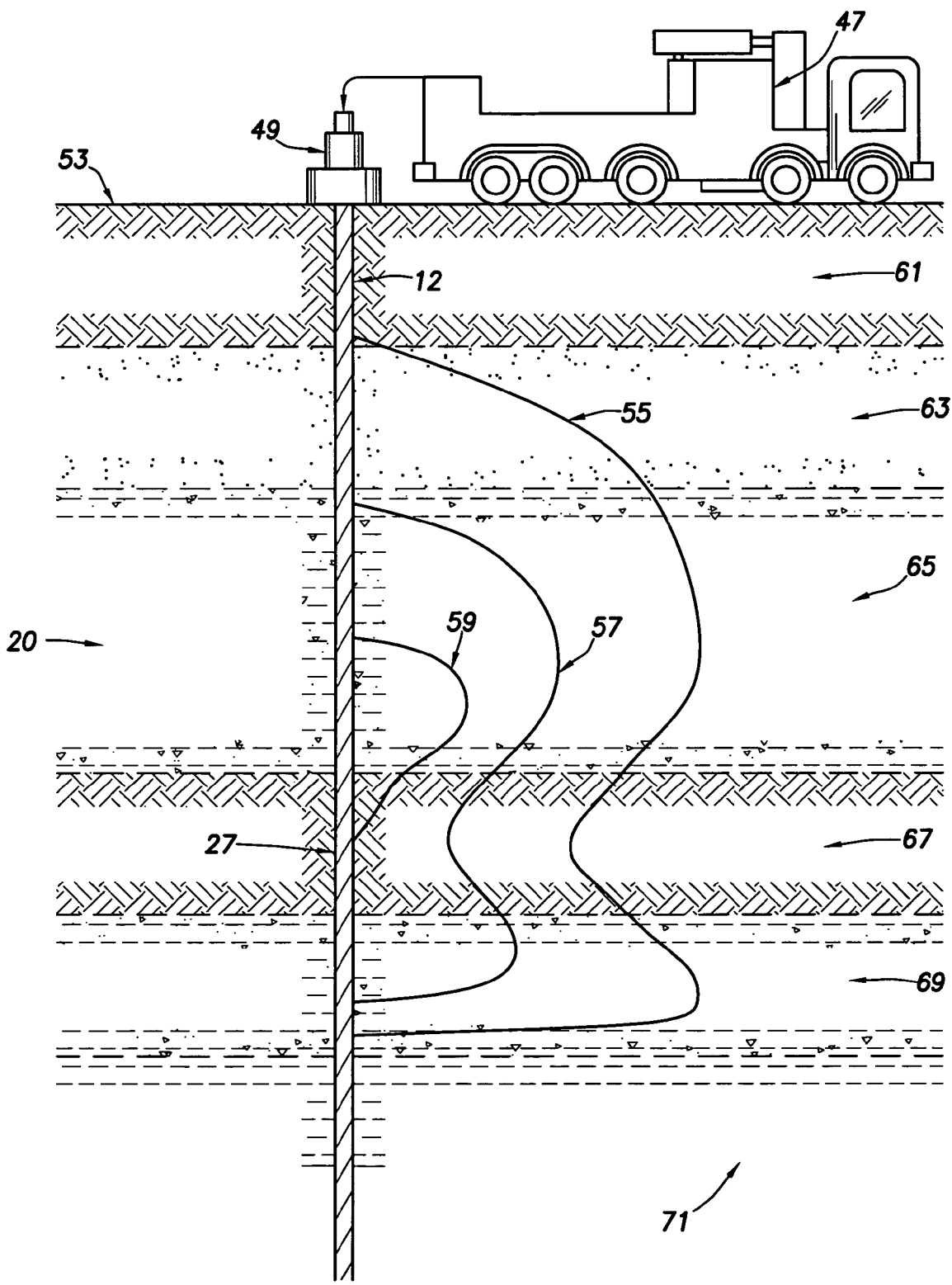
FIGS. 13 and 14 illustrate a 'multi-layered reservoir', the Hydraulic Fracturing Simulator software of FIG. 16 modeling the 'multi-layered reservoir'.

Referring to FIG. 13, a reservoir or Earth formation 20 is shown. In FIG. 13, pumping truck 47 provides fluid at high pressures and flow rates to wellhead 49, which is operably connected to the wellbore 12 at or near the ground surface 53. FIG. 13 illustrates the fracture boundary 55 at a particular time. Two other fracture fluid boundaries 57 and 59 also are indicated in FIG. 13. In FIG. 13, the reservoir 20 represents a 'multi-layered reservoir' 20 because the reservoir 20 in FIG. 13 includes the following plurality of layers 61-71 of Earth formation where the layers 61-71 represent various zones or laminations of underground geological formation: (1) a first layer 61 of 'shale', (2) a second layer 63 of 'sandstone', (3) a third layer 65 representing an 'oil/gas pay zone', (4) a fourth layer 67 of 'shale', (5) a fifth layer 69 representing an 'oil/gas pay zone', and (6) a sixth layer 71 being a 'water-bearing zone'. The fluid boundaries in FIG. 13 reveal separate types or compositions of pumped fluid. In FIG. 13, the fracture preferably is stopped prior to the water bearing zone 71 seen at the lower portion of FIG. 13.

Figure 14:
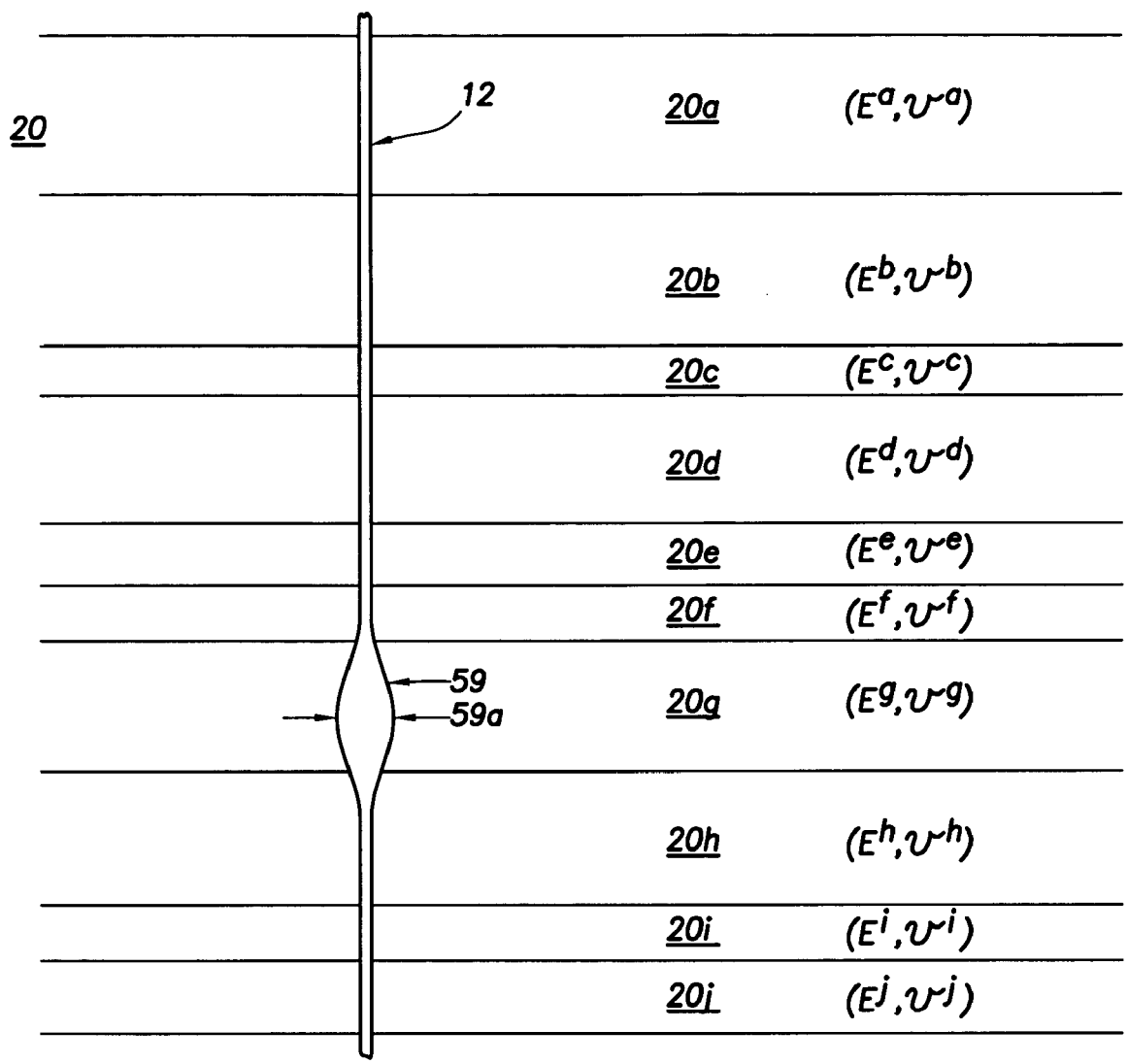

Referring to FIG. 14, a 'multilayered', hydraulically fractured reservoir 20 or Earth formation 20 is penetrated by a wellbore 12. The wellbore 12 penetrates the Earth formation 20 and the hydraulic fracture 59 of FIG. 13 is shown between layers 20f and 20h. The fracture 59 has a fracture width 59a which was created in response to the pressurization of the formation 20 by a fracturing fluid. In FIG. 14, the 'multilayered' reservoir/Earth formation 20 includes a plurality of Earth formation layers 20a, 20b, 20c, 20d, 20e, 20f, 20g, 20h, 20i, and 20j. Each of the layers 20a-20j can be characterized by a Young's Modulus (E) and a Poisson's Ratio (v). The Young's Modulus (E) and the Poisson's Ratio (v) describe the elastic properties of each of the layers 20a-20j in FIG. 14. For example, the elastic properties of layer 20a can be characterized by Young's Modulus and Poisson's Ratio ($E^a$, $v^a$), the elastic properties of layer 20b being characterized by Young's Modulus and Poisson's Ratio ($E^b$, $v^b$), the elastic properties of layer 20c being characterized by Young's Modulus and Poisson's Ratio ($E^c$, $v^c$), the elastic properties of layer 20d being characterized by Young's Modulus and Poisson's Ratio ($E^d$, $v^d$), the elastic properties of layer 20e being characterized by Young's Modulus and Poisson's Ratio ($E^e$, $v^e$), the elastic properties of layer 20f being characterized by Young's Modulus and Poisson's Ratio ($E^f$, $v^f$), the elastic properties of layer 20g being characterized by Young's Modulus and Poisson's Ratio ($E^g$, $v^g$), the elastic properties of layer 20h being characterized by Young's Modulus and Poisson's Ratio ($E^h$, $v^h$), the elastic properties of layer 20i being characterized by Young's Modulus and Poisson's Ratio ($E^i$, $v^i$), and the elastic properties of layer 20j being characterized by Young's Modulus and Poisson's Ratio ($E^j$, $v^j$).

Figure 15:
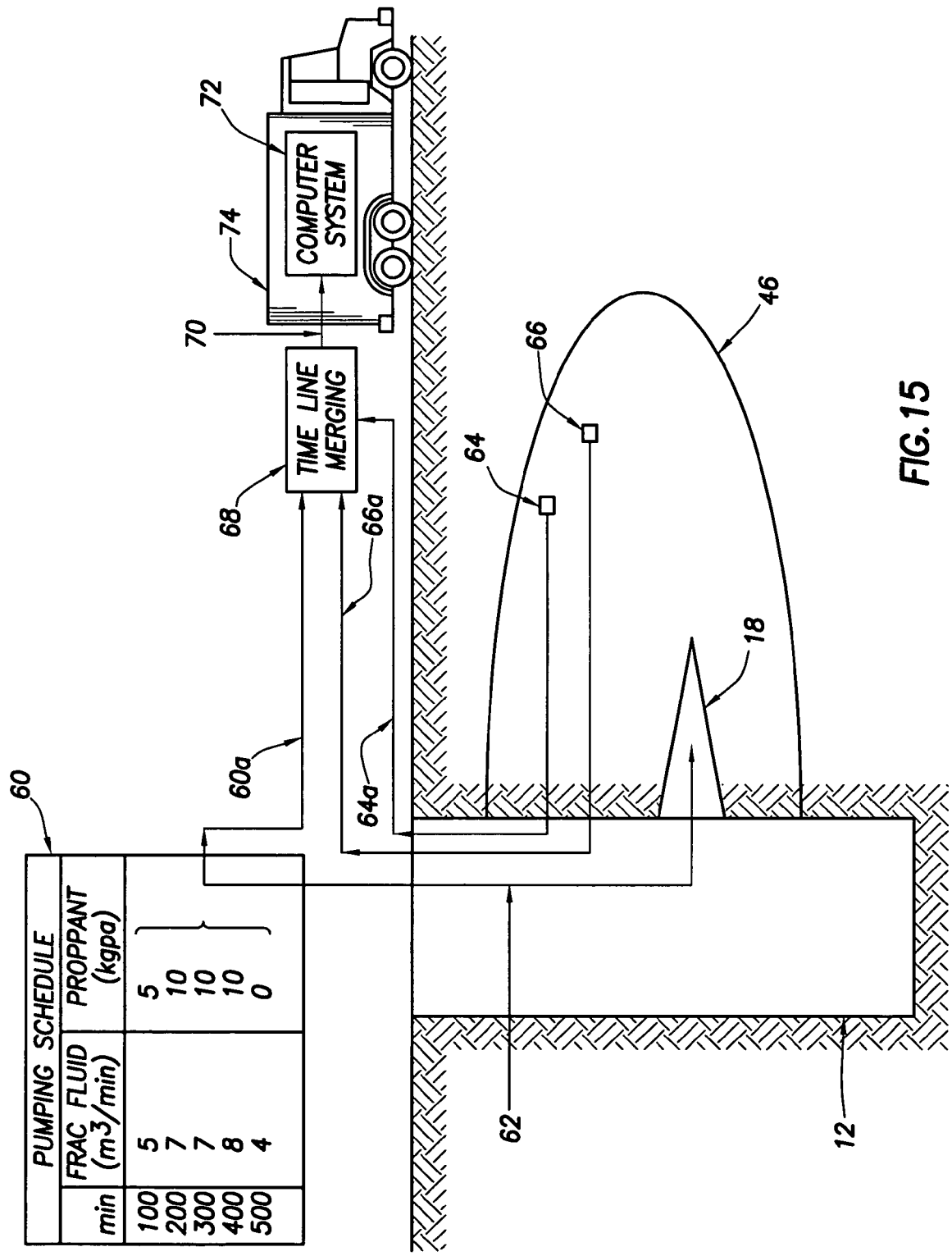
FIG. 15 illustrates an apparatus used in connection with a Hydraulic Fracturing (HF) job adapted for fracturing a formation penetrated by a wellbore, the apparatus including a computer system for storing a software called a 'Hydraulic Fracturing Simulator software'.

Referring to FIG. 15, the pump trucks 30 of FIG. 4 will pump a fracturing fluid 62 (usually including proppant) down the wellbore 12 of FIG. 4 in accordance with a pumping schedule 60 (an example used in connection with this discussion). The fracturing fluid 62 will enter the perforations 18, and, responsive thereto, create a 'fracture footprint' 46, similar to the fracture footprint 46 shown in FIG. 6. Micro-seismic data sensor(s) 64 and tiltmeter data or other sensor(s) 66 will monitor the approximate geometry of the fracture footprint 46 and, responsive thereto, the sensor(s) 64 and 66 will generate output signals, the micro-seismic data sensor(s) 64 generating a micro-seismic data output signal 64a, the tiltmeter data sensor(s) 66 generating a tiltmeter data output signal 66a, and the pumping schedule 60 generating a pumping schedule output signal 60a representative of the pumping schedule 60. The pumping schedule output signal 60a, the tiltmeter data output signal 66a, and the micro-seismic data output signal 64a are time line merged via a 'time line merging' step 68. In this 'time line merging' step 68, the pumping schedule output signal 60a, the tiltmeter data output signal 66a, and the micro-seismic data output signal 64a are 'time synchronized' in a particular manner such that the tiltmeter data output signal(s) 66a and the micro-seismic data output signal(s) 64a are synchronized with the times present in the pumping schedule 60. When the 'time line merging' step 68 is complete, a 'time line merged pumping schedule and tiltmeter data and micro-seismic data' output signal 70 is generated which is provided as 'input data' to a 'computer system' 72 optionally disposed within a truck 74 situated at the site of the wellbore 12, such as a monitoring truck 74 or a 'FracCAT vehicle' 74 (which is a vehicle with software that monitors and measures the fracture and controls the fracture treatment).

Figure 16:
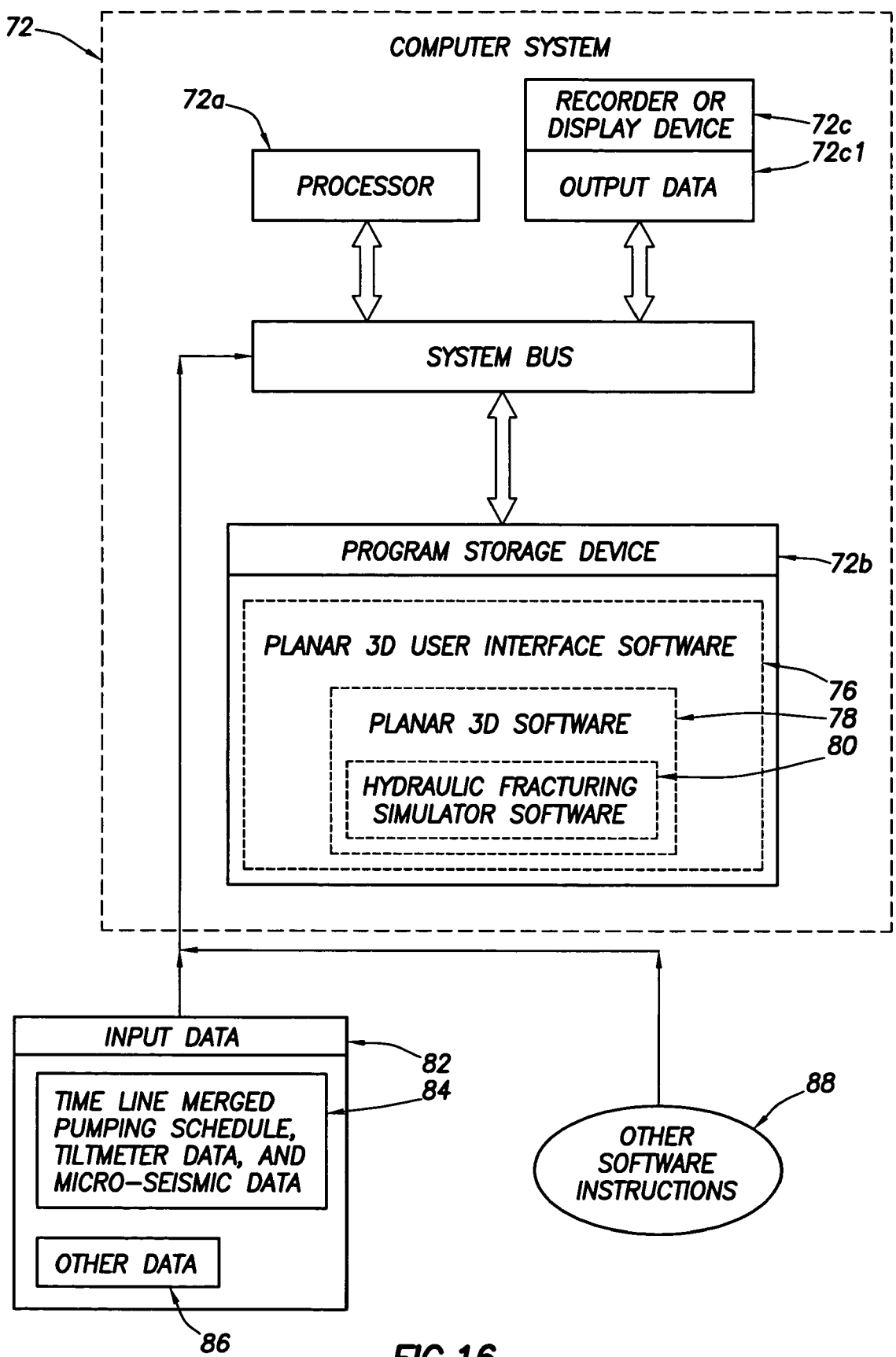
FIG. 16 illustrates the computer system of FIG. 15 which stores the software called a 'Hydraulic Fracturing Simulator software' adapted for modeling a 'multilayered reservoir' and for modeling 'partially active elements' of a mesh overlaying a fracture footprint during a 'petroleum reservoir fracturing' event.

Referring to FIG. 16, the 'computer system' 72 which is optionally disposed within the truck 74 of FIG. 15, such as the 'FracCAT vehicle' 74, is illustrated. In FIG. 16, recall that the 'time line merged pumping schedule and tiltmeter data and micro-seismic data' output signal 70 of FIG. 15 is provided as 'input data' to the computer system 72 disposed within the truck 74, the output signal 70 being comprised of a time line merged pumping schedule and tiltmeter data and micro-seismic data plus other data including downhole temperature and bottom hole pressure. The computer system 72 of FIG. 16 includes a processor 72a operatively connected to a system bus, a memory or other program storage device 72b operatively connected to the system bus, and a recorder or display device 72c operatively connected to the system bus. The memory or other program storage device 72b stores the following software (76, 78, and 80): a Planar 3D User Interface software 76, a Planar 3D 'engine' or software 78, and a Hydraulic Fracturing Simulator Software 80. The software 76, 78, and 80, which is stored in the memory 72b of FIG. 16, can be initially stored on a CD-ROM, where that CD-ROM is also a 'program storage device'. That CD-ROM can be inserted into the computer system 72, and, then, the software 76, 78, and 80, which includes the Hydraulic Fracturing Simulator Software 80, can be loaded from that CD-ROM and into the memory/program storage device 72b of the computer system 72 of FIG. 16. The Hydraulic Fracture Simulator Software 80 will be described in detail in the following paragraphs. The computer system 72 of FIG. 16 receives Input Data 82, including: (1) the time line merged pumping schedule, tiltmeter data, and micro-seismic data 84 (which corresponds to the 'time line merged pumping schedule and tiltmeter data and micro-seismic data' output signal 70 of FIG. 15), and (2) Other Data 86. The computer system 72 also receives Other Software Instructions 88. The processor 72a will execute the Hydraulic Fracturing Simulator Software 80 (including the Planar 3D User Interface software 76 and the Planar 3D 'engine' 78), while simultaneously using the Input Data 82 and Other Software Instructions 88; and, responsive thereto, the recorder or display device 72c will generate a set of 'Output Data' 72c1 which is adapted to be recorded by or displayed on the recorder or display device 72c. The computer system 72 may be a personal computer (PC), a workstation, or a mainframe. Examples of possible workstations include a Silicon Graphics Indigo 2 workstation or a Sun SPARC workstation or a Sun ULTRA workstation or a Sun BLADE workstation. The memory or program storage device 72b is a computer readable medium or a program storage device which is readable by a machine, such as the processor 72a. The processor 72a may be, for example, a microprocessor, microcontroller, or a mainframe or workstation processor. The memory or program storage device 72b, which stores the Hydraulic Fracturing Simulator Software 80, may be, for example, a hard disk, ROM, CD-ROM, DRAM, or other RAM, flash memory, magnetic storage, optical storage, registers, or other volatile and/or non-volatile memory.

Figure 18:
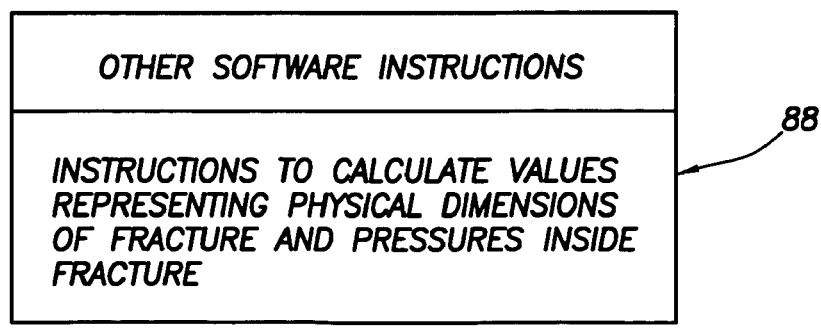
FIG. 18 illustrates the 'Other Software Instructions' of FIG. 16.
Figure 17:
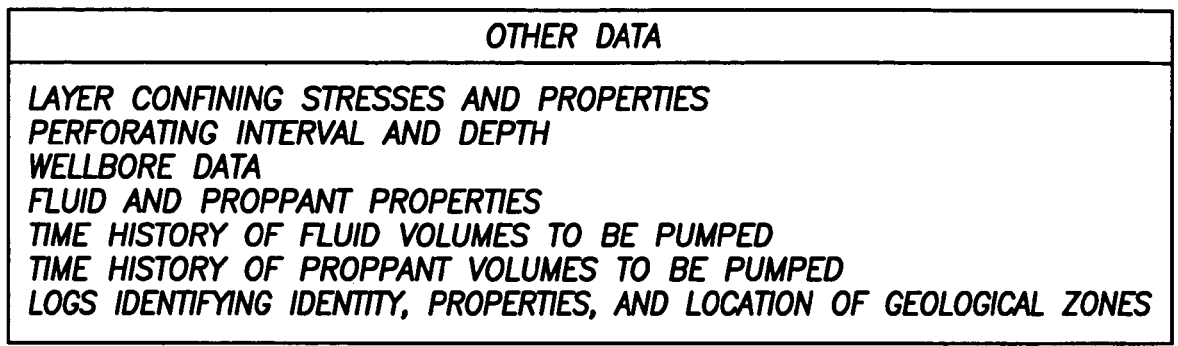
FIG. 17 illustrates in greater detail the 'Other Data' of FIG. 16.

Referring to FIGS. 17 and 18, the Other Data 86 and the Other Software Instructions 88 of FIG. 16 are illustrated. In FIG. 17, the Other Data 86 will include: layer confining stresses and properties, perforating interval and depth, wellbore data, fluid and proppant properties, time history of fluid volumes to be pumped, time history of proppant volumes to be pumped, and logs identifying the identity, properties, and location of geological zones. In FIG. 18, the Other Software Instructions 88 include instructions to calculate values representing physical dimensions of the fracture and pressures inside the fracture.

Referring to FIG. 19, a construction of the Hydraulic Fracturing Simulator Software 80 disposed within the Planar 3D software 78 and the Planar 3D User Interface 76 is illustrated. In FIG. 19, the Input Data 82 is provided to the Planar 3D User Interface 76, to the Planar 3D software 78, and to the Hydraulic Fracturing Simulator Software 80. The Hydraulic Fracturing Simulator Software 80 includes: an initial 'time stepping' step 90, a second step 92 which calculates fracture width (w) given the fluid pressure (p); a third step 94 which calculates fluid pressure (p) given the fracture width (w); and a fourth step 96 adapted to update the fracture footprint. The fracture 'footprint' is shown in FIGS. 4 and 13 at times $t_1$, $t_2$, $t_3$, ..., $t_n$ (for example at times $t_1$, $t_2$, $t_3$, and $t_4$ in FIG. 4 and at times corresponding to the three boundaries 59, 57 and 55 in FIG. 13). In operation, note the time stepping loop 98 in FIG. 19 wherein the 'time stepping' step 90 will increment from a first time step ($t_1$), to a second time step ($t_2$), to a third time step ($t_3$), ..., and to an nth time step ($t_n$). Operating within the first time step $t_1$, the second step 92 and the third step 94 will iterate on each other (as indicated by arrow 100) until the fracture width (w) and the fluid pressure (p) are solved at every point (i.e., within each 'element' or 'grid cell') in the fracture geometry of FIGS. 4 and 13. When the iteration 100 of steps 92 and 94 has converged, the fracture footprint is updated in step 96. In step 97, the proppant concentration is calculated for each grid cell in the updated fracture footprint. The 'output data' 72c1, associated with the last iteration loop 100, is generated and stored.

The time step 90 is then incremented to the second time step $t_2$, and, responsive thereto, the second step 92 and the third step 94 will then iterate again on each other (as indicated by arrow 100) until the fracture width (w) and the fluid pressure (p) are solved at every grid cell in the fracture geometry of FIGS. 4 and 13. When the iteration 100 of steps 92 and 94 has converged, the fracture footprint is updated in step 96. In step 97, the proppant concentration is calculated for each grid cell in the updated fracture footprint. The 'output data' 72c1, associated with the last iteration loop 100, is generated and stored. The time step 90 is then incremented once again to the third time step $t_3$, the second step 92 and the third step 94 will then iterate again on each other (as indicated by arrow 100) until the fracture width (w) and the fluid pressure (p) are solved at every point (i.e., within each 'element' or 'grid cell') in the fracture geometry of FIGS. 4 and 13. When the iteration 100 of steps 92 and 94 is complete, the fracture footprint is updated in step 96. In step 97, the proppant concentration is calculated for each grid cell in the updated fracture footprint. The 'output data' 72c1, associated with the last iteration loop 100, is generated and stored. The time step 90 is then incremented once again, and the above process repeats until it has reached the end of the pumping schedule. 'Convergence' takes place when the 'solution does not change from one iteration to the next'. The inner iteration loop 100 is solving for two things: (1) fracture width (w) using the 'elasticity equation', and (2) fluid pressure (p) using the 'fluid flow equation'. Thus, the 'solution does not change from one iteration to the next' when the change in the 'elasticity equation' solution and when the change in the 'fluid flow equation' solution is below a 'tolerance'. When the change in the 'elasticity equation' solution and the change in the 'fluid flow equation' solution is below the 'tolerance', we know that the inner iteration loop 100 has converged. Steps 92 and 94 can be solved in various ways, such as by iteration of two equations as shown here, or by direct substitution of the one equation into the other equation, or vice-versa.

The Output Data 72c1 is generated at the end of each time step. However, 'additional output data' 99 is generated when the time stepping in the outer iteration loop 98 is complete, the 'additional output data' 99 being used in subsequent calculations, such as in the generation of other graphical plots.

In FIG. 19, however, before the second step 92, a first step 102 is practiced, the first step 102 being called 'Set Up Influence Coefficient Matrix [C]' 102. The 'Set Up Influence Coefficient Matrix [C]' step 102 of FIG. 19 will be discussed below with reference to FIG. 20 of the drawings.

Figure 20:
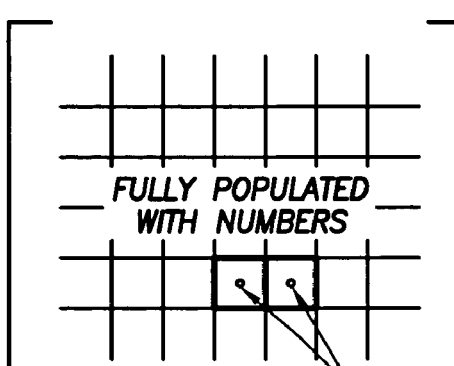
FIG. 20 illustrates the function associated with the 'Set Up Influence Coefficient Matrix [C]' step associated with the construction of the 'Hydraulic Fracturing Simulator software' which is illustrated in FIG. 19.

Referring to FIG. 20, a 'Multi-Layer Elasticity Equation' 104 is illustrated. Recall from FIG. 19 that step 92 will calculate the fracture width (w) and step 94 will calculate the fluid pressure (p). In FIG. 20, the fracture width (w) of step 92 is actually calculated by using the 'Elasticity Equation' 104. In the 'Elasticity Equation' 104, the fracture width (w) 106 is calculated given the inverse of a 'Matrix of Influence Coefficients [C]' 108 (also known as an 'Influence Coefficient Matrix') multiplied by (fluid pressure p 110 minus confining stress $\sigma_c$ 112), as follows:

$$\{w\}=[C]^{-1}\{p-\sigma_c\}, \text{where} \qquad \text{Elasticity Equation 104}$$

w is the fracture width 106,
[C] is the 'matrix of influence coefficients' 108,
p is the fluid pressure 110, and
$\sigma_c$ is the confining stress 112.

In FIG. 20, a generic form of the 'Influence Coefficient Matrix [C]' 108 is shown, where the 'Influence Coefficient Matrix [C]' 108 has 'M' rows and 'M' columns. In FIG. 20, the 'Influence Coefficient Matrix [C]' 108 is fully populated with numbers 114 and is used to calculate fracture width (w) for step 92 in FIG. 19.

The 'elasticity equation' 104 did not previously take into account the existence of a 'multilayered reservoir' of the type illustrated in FIGS. 13 and 14, and the 'elasticity equation' 104 did not previously take into account the existence of 'partially active elements', such as the 'partially active elements' 25, 27, 29, and 43 of FIG. 10. However, in a real reservoir, a 'multilayered reservoir' does exist. Furthermore, when overlaying a mesh over a fracture footprint in the manner illustrated in FIG. 10, 'partially active elements' also do exist.

Therefore, the Hydraulic Fracturing Simulator Software 80 of FIG. 16 disclosed in this specification will include the effect of, and take into account the existence of, 'multilayered reservoirs' and 'partially active elements'. Consequently, in order to take into account the existence of 'multilayered reservoirs' and 'partially active elements', it is necessary to execute the 'set Up Influence Coefficient Matrix [C]' step 102 of FIG. 19, associated with the Hydraulic Fracturing Simulator Software 80 of FIGS. 16 and 19. The 'Set Up Influence Coefficient Matrix [C]' of Step 102 of FIG. 19 will calculate the 'Influence Coefficient Matrix [C]' 108 in the 'Elasticity Equation' 104 of FIG. 20 in a special way in order to allow the Hydraulic Fracturing Simulator software 80 to include the effect of, or take into account the existence of, the 'multilayered reservoirs' and the 'partially active elements'. When the 'Influence Coefficient Matrix [C]' 108 of the 'elasticity equation' 104 of FIG. 20 is calculated (by the 'Set Up Influence Coefficient Matrix [C]' step 102 of FIG. 19 associated with the Hydraulic Fracturing Simulator Software 80 of FIGS. 16 and 19) in this special way, the numbers 114 in the 'Influence Coefficient Matrix [C]' 108 will be changed accordingly; and, when the numbers 114 of the 'Influence Coefficient Matrix [C]' 108 are changed accordingly, the Hydraulic Fracturing Simulator Software 80 will then include the effect of, or take into account the existence of, the 'multilayered reservoirs' and the 'partially active elements'. As disclosed in this specification, there is a systematic way for determining and changing the numbers 114 in the 'Influence Coefficient Matrix' 108 of FIG. 20 in order to include or take into account the existence of the 'multilayered reservoirs' and the 'partially active elements'. Consequently, the following pages of this specification will present a 'method' (along with an accompanying 'system' and 'program storage device') for determining how the numbers 114 in the 'Influence Coefficient Matrix [C]' 108 will be changed (by the 'Set Up Influence Coefficient Matrix' step 102 of FIG. 19) for the ultimate purpose of allowing the Hydraulic Fracturing Simulator Software 80 to include the effect of, or take into account the existence of, the 'multilayered reservoirs' of FIGS. 13-14 (such as the 'multilayered reservoir' 20 having multiple layers 61-71 of FIG. 13) and the 'partially active elements' of FIG. 10 (such as the 'partially active elements 25, 27, 29, and 43 of FIG. 10).

Figure 21:
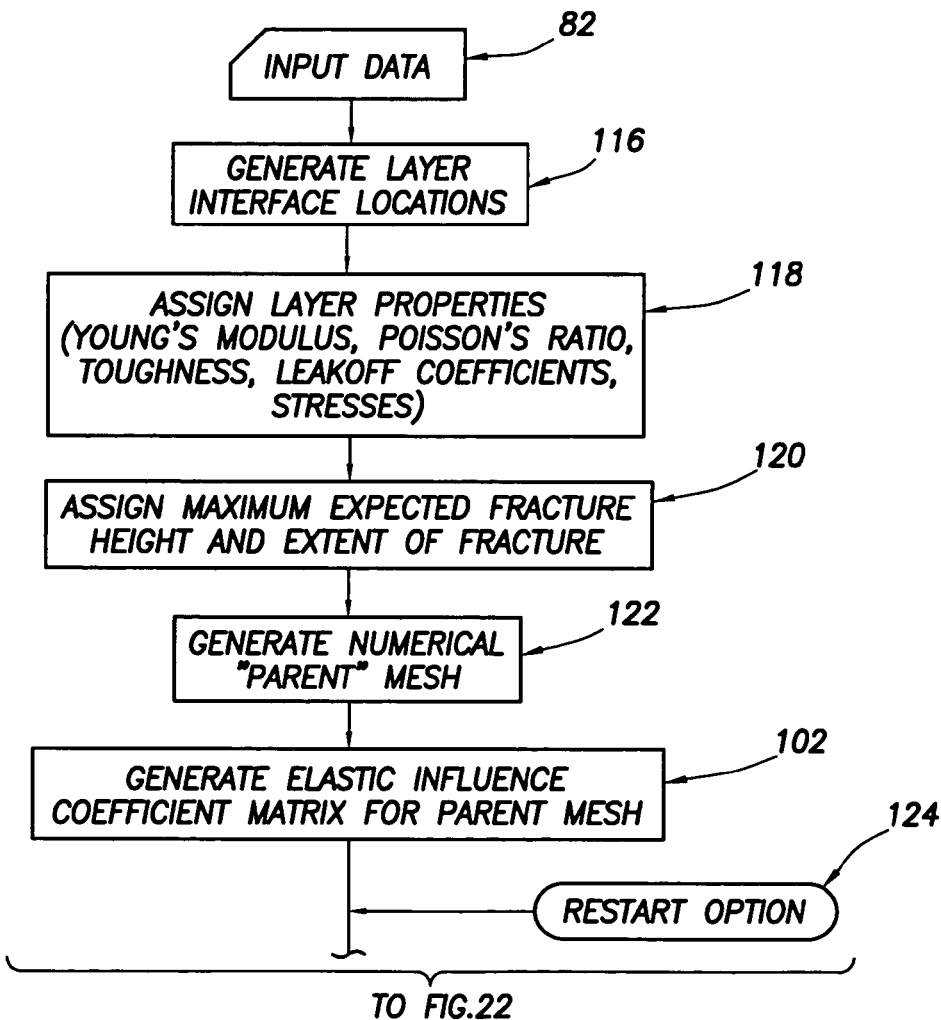
FIGS. 21 and 22 illustrate a more detailed construction of the 'Hydraulic Fracturing Simulator software' which is illustrated in FIG. 19.
Figure 22:
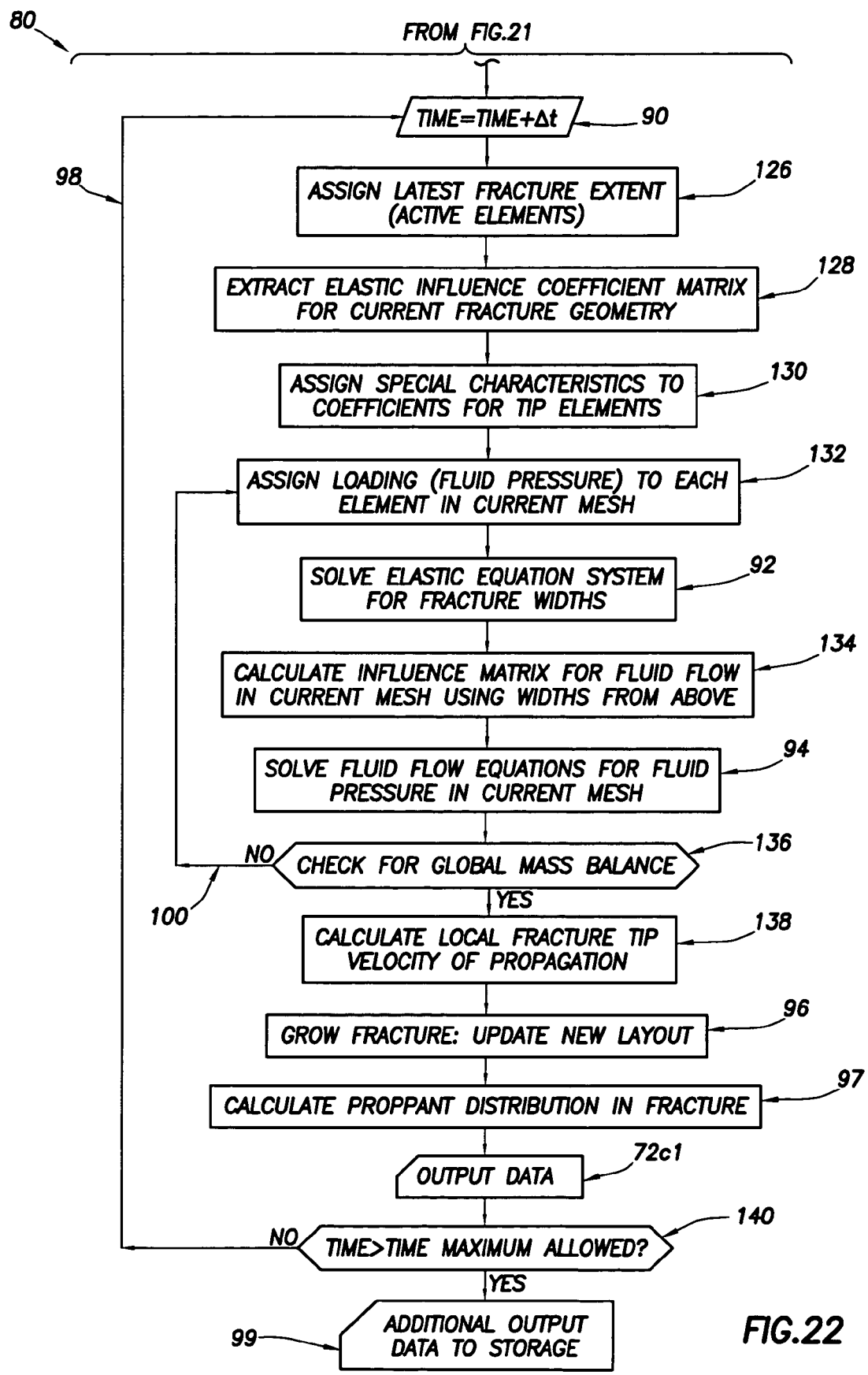

Referring to FIGS. 21 and 22, a more detailed construction of the Hydraulic Fracturing Simulator Software 80 of FIG. 19, which is disposed within the Planar 3D software 78 and the Planar 3D User Interface 76, is illustrated.

In FIG. 21, the input data 82 is provided from the human interface, such as the injection rate and the pumping schedule, which includes the injection rate as a function of time, proppant concentration, fluid viscosity, the geology or the properties of the elastic layers of the reservoir including the elastic constants comprising the Young's Modulus and the Poisson's Ratio (E, ν) as previously described, and the leakoff behavior. In FIG. 21, in the 'Generate Layer Interface Locations' step 116, the depths of each of the 'interfaces' of the 'layers' of FIG. 13 are calculated, such as the end of the sandstone layer, the end of the gas layer, etc. In the 'Assign Layer Properties (Young's Modulus, Poisson's Ratio, Toughness, Leakoff Coefficients, Stresses)' step 118, the Young's Modulus, Poisson's Ratio, Toughness, Leakoff Coefficients, and Stresses are assigned to each of the 'layers' (of FIG. 13) the depths of which were calculated in step 116. Therefore, a series of numbers (comprising the Young's Modulus, Poisson's Ratio, Toughness, Leakoff Coefficients, and Stresses) is assigned to each Earth formation 'layer' that is shown in FIG. 13. In the 'Assign Maximum Expected Fracture Height and Extent of Fracture' step 120 of FIG. 21, before any simulation is performed, the maximum possible 'length' to which the 'fracture' will propagate and the maximum possible 'height' to which the 'fracture' will propagate is assumed or introduced. Then a parent mesh is assigned to the 'fracture surface', where the parent mesh is divided into rectangular 'elements'. See FIGS. 7 and 10 for examples of the parent mesh. The parent mesh is broken down into rows and columns comprising 'grids' or 'elements' which are generally rectangular in shape. It is assumed that the 'fracture' will grow into the 'elements' of the parent mesh, but no further. In the 'Generate Numerical Parent Mesh' step 122, the numerical parent mesh is generated; that is, in step 122, the 'coordinates' of each 'grid cell' or 'element' of the parent mesh are generated. The 'coordinates' will define where each 'grid cell' or 'element' exists within an axis system, such as the (x, y) axis system. Therefore, in step 122 of FIG. 21, the 'coordinates' of each of the 'grid cells' (such as 'grid cells' 23, 25, 29, and 43 shown in FIG. 10 or each of the 'grid cells' 48a1 and 52 shown in FIG. 7) are allocated. At this point, we know where our 'layers' exist, we know the numerical mesh which includes the rectangular mesh of elements, and we know where the fracture exists within the parent mesh including all their coordinates. In FIG. 21, the next step is the 'Generate Elastic Influence Coefficient Matrix for Parent Mesh' step 102 which is the 'Set up Influence Coefficient Matrix [C]' step 102 of FIG. 19. In step 102 of FIGS. 19 and 21, the Influence Coefficient Matrix [C] (108 of FIG. 20) is generated. As previously mentioned, the Influence Coefficient Matrix [C] (as shown in FIG. 20) comprises rows and columns of 'numbers' 114, the Influence Coefficient Matrix [C] being fully populated with such 'numbers' 114. Each of the 'numbers' 114 of the Influence Coefficient Matrix [C] will indicate how one 'element' of the mesh relates to another 'element' of the mesh in an 'elastic manner'. For example, if a fracture exists within one 'element' of the mesh, what kind of stress or strain exists within another 'element' of the mesh in response thereto (a phenomenon that is called an 'elasticity behavior'). Each of the 'numbers' 114 in the Influence Coefficient Matrix [C] describes this 'elasticity behavior'. Therefore, the Influence Coefficient Matrix [C] (108 of FIG. 20) is a matrix that indicates how one 'element' of the parent mesh (such as the mesh shown in FIGS. 7 and 10) talks to another 'element' of the parent mesh in an 'elastic manner'. Therefore, step 102 of FIGS. 19 and 21 (i.e., the 'Set Up Influence Coefficient Matrix' step 102 of FIG. 19 and the 'Generate Elastic Influence Coefficient Matrix for Parent Mesh' step 102 of FIG. 21), which determines the Influence Coefficient Matrix 108 of FIG. 20, is responsible for allowing the Hydraulic Fracturing Simulator Software 80 of FIG. 16 to simulate the 'multi-layered reservoir' of FIG. 13 and the 'partially active elements' of FIGS. 10, 11, and 12. Step 124 of FIG. 21 entitled the 'Restart Option' will allow the user to restart the simulator without having to recalculate the Influence Coefficient Matrix (it is stored on the hard drive). Such situations will occur if the reservoir properties are unchanged, but the user wants to change the injection schedule, for example.

In FIG. 22, the 'Time=Time+Δ t' step 90 is a 'time stepping' step. Note the loop 98 which represents a time stepping loop. The loop 98 controls how the fracture grows as a function of time during the duration of the 'pumping schedule', where the term 'pumping schedule' includes the 'shut-in time'. In the 'Assign Latest Fracture Extent (Active Elements)' step 126, at any particular time step, the fracture will have propagated to some extent in the parent mesh, which is called the 'footprint' of the fracture; step 126 will sweep through all the 'grid cells' in the entire parent mesh, and then step 126 will determine if a particular 'element' or 'grid cell', within the perimeter of the 'fracture footprint', is an 'inactive element', or an 'active element', or a 'partially active element'. In step 128 entitled 'Extract Elastic Influence Coefficient Matrix for Current Fracture Geometry', the Influence Coefficient Matrix [C] 108, as previously described with reference to step 102, contains 'all possible combinations within the parent mesh'; and, at any particular time step, we need a subset of the aforementioned 'all possible combinations within the parent mesh'; thus, step 128 extracts, from the Influence Coefficient Matrix [C] 108, a 'submatrix' which contains essential information regarding the current size of the 'fracture footprint'. In step 130 entitled 'Assign Special Characteristics to Coefficients for Tip Elements', a 'particular subset' of the 'grid cells' or 'elements' of the parent mesh will cross a 'perimeter of the fracture footprint'; in connection with only the 'particular subset' of the 'grid cells' which cross the 'perimeter of the fracture footprint', it is necessary to change some of the properties of the 'submatrix' (and recall that the 'submatrix' contains essential information regarding the current size of the 'fracture footprint'); step 130 will make this change to the 'submatrix'; consequently, step 130 in FIG. 22 entitled 'Assign Special Characteristics to Coefficients for Tip Elements' will deal specifically with the 'partially active elements' of FIGS. 10, 11, and 12; that is, step 130 in FIG. 22 will change the 'partially active element submatrix' (i.e., a submatrix which pertains specifically to the 'partially active elements') by 'assigning special characteristics to the coefficients' in the 'partially active element submatrix'. In step 132 entitled 'Assign Loading (Fluid Pressure) to Each Element in Current Mesh', we now have a current time step and a current fracture footprint; in addition, each 'active element' has a 'fluid pressure'; thus, step 132 will assign a 'fluid pressure' to each 'element' of the parent mesh. In step 92 entitled 'Solve Elastic Equation System for Fracture Widths', we use the 'elasticity equation' 104 of FIG. 20 (including their Fourier Transforms) to solve for the 'fracture width' in each 'element' or 'grid cell' of the mesh, at the current time step, given the 'fluid pressure' that was assigned to each 'element' of the mesh in step 132. In step 134 entitled 'Calculate Influence Matrix for Fluid Flow in Current Mesh Using Widths from Above', now that we have calculated the 'fracture width' in each 'element' at the current time step from step 92, we can do the same thing for the fluid flow equations in step 94. Therefore, in step 94 entitled 'Solve Fluid Flow Equations for Fluid Pressure in Current Mesh', we can solve for the 'fluid pressures'. Note the loop 100 in FIG. 22 whereby, when the 'fluid pressures' are determined in step 94, those 'fluid pressures' determined from step 94 are used to solve for 'fracture widths' in step 92, and that loop 100 will continue to process as indicated until 'global mass balance' is achieved in step 136. Thus, from step 136 to step 132, an inner iteration will take place; in that inner iteration, we continue to iterate on fluid pressure and fracture width until convergence of the solution takes place at that time step; convergence takes place when the solution does not change from one iteration to the next. The inner iteration loop 100 is solving for two things: (1) fracture width using the 'elasticity equation', and (2) the fluid pressure using the 'fluid flow equation'; when the change in each of these 'equations' is below a tolerance, we know that the inner iteration 100 has converged. Steps 138 and 96 involve updating for the next time step. Step 138 ('Calculate Local Fracture Tip Velocity of Propagation') and step 96 ('Grow Fracture: Update New Layout') are described in prior pending application Ser. No. 10/831,799, filed Apr. 26, 2004, now U.S. Pat. No. 7,063,147 directed to the 'VOF Algorithm', entitled "Method and Apparatus and Program Storage Device for Front Tracking in Hydraulic Fracturing Simulators", the disclosure of which is incorporated by reference into the specification of this application. In step 97, the proppant concentration is calculated for each grid cell in the updated fracture footprint. The 'output data' 72c1, associated with the last iteration loop 100, is generated and stored. In step 140, if the time is not greater than the maximum allowed, time step 90 is incremented once again, and the above process repeats until it has reached the end of the pumping schedule. In step 140, if the 'time' is greater than the maximum allowed, 'additional output data' 99 is generated. The 'output data' 72c1 and the 'additional output data' 99 is stored in a storage device, such as the memory or program storage device 72b of FIG. 16. In FIG. 22, the Output Data 72c1 includes, at each time step, the fluid pressure (p) and the fracture width (w) at each of the 'elements' or 'grid cells' 23, 25, 29, and 43 shown in FIG. 10 or each of the 'elements' or 'grid cells' 48a1 and 52 shown in FIG. 7 (again, at each time step). Since the Output Data 72c1 includes fluid pressure (p) and fracture width (w) for each 'grid cell' of FIGS. 7 and 10 at each time step, the Output Data 72c1 can also include a number of 2D or 3D plots representative of the fluid pressure (p) and the fracture width (w) at each of the 'elements' or 'grid cells' 23, 25, 29, and 43 shown in FIG. 10 or each of the 'elements' or 'grid cells' 48a1 and 52 shown in FIG. 7 at each time step. Steps 92, 134, and 94 can be solved in various ways, such as by iteration of the two equations shown here (i.e., the 'elasticity equation' and the 'fluid flow equation'), or by direct substitution of one equation into the other equation, or vice-versa.

Recall that the 'Set Up Influence Coefficient Matrix [C]' step 102 in FIG. 19 and the 'Generate Elastic Influence Coefficient Matrix for Parent Mesh' step 102 in FIG. 21 will recalculate the Influence Coefficient Matrix 108 in FIG. 20 in a 'special way' in order to allow the 'Hydraulic Fracturing Simulator software' 80 of FIGS. 16 and 19 to model, or take into account the existence of, 'partially active elements' (of the type illustrated in FIGS. 10, 11, and 12). The concept of 'partially active elements', such as the 'partially active elements' 25, 27, 29, and 43 shown in FIGS. 10, 11, and 12, is set forth in the following two publications, each of which is incorporated herein by reference: (1) Ryder, J. A. and Napier, J. A. L. 1985, *Error Analysis and Design of a Large Scale Tabular Mining Stress Analyzer*, Proceedings of the Fifth International Conference on Numerical Methods in Geomechanics, Nagoya, Japan, [Balkema] 1549-1555, the disclosure of which is incorporated by reference into the specification of this application; and (2) J. A. Ryder, Eds.: E. G. Beer, J. R. Booker, and J. P. Carter, *Optimal Iteration Schemes Suitable for General Non-linear Boundary Element Modeling Applications*: Proceedings of the 7th International Conference on Computer Methods and Advances in Geomechanics, Cairns, Australia,[Balkema], 1991, the disclosure of which is incorporated by reference into the specification of this application.

Figure 23:
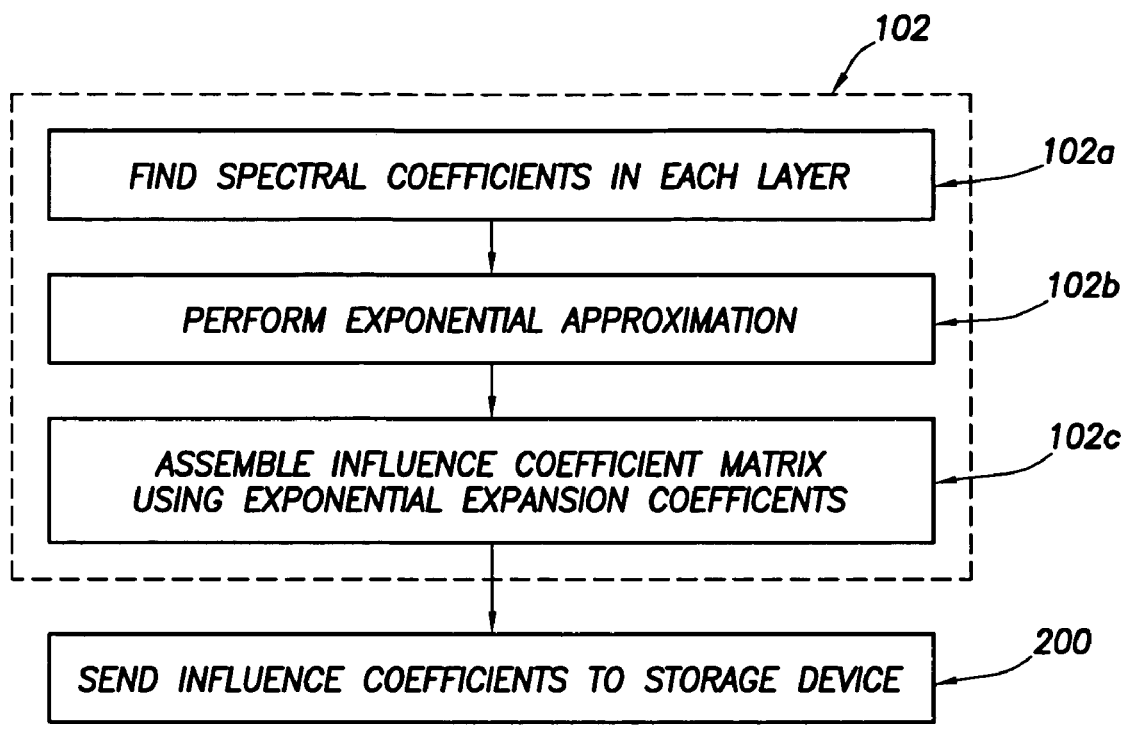

Referring to FIGS. 23 and 24, a construction of the 'Set Up Influence Coefficient Matrix [C]' step 102 of FIG. 19 and the 'Generate Elastic Influence Coefficient Matrix for Parent Mesh' step 102 of FIG. 21, which would allow the 'Hydraulic Fracturing Simulator software' 80 of FIGS. 16 and 19 to model or take into account the existence of a 'multi-layer reservoir' (of the type illustrated in FIG. 13), is illustrated. In FIGS. 23 and 24, recall that the 'Set Up Influence Coefficient Matrix [C]' step 102 in FIG. 19 and the 'Generate Elastic Influence Coefficient Matrix for Parent Mesh' step 102 in FIG. 21 will also recalculate the Influence Coefficient Matrix 108 in FIG. 20 in a 'special way' in order to allow the 'Hydraulic Fracturing Simulator software' 80 of FIGS. 16 and 19 to model or take into account the existence of a 'multi-layer reservoir' (of the type illustrated in FIG. 13).

In FIGS. 23 and 24, a 'construction of the Set Up Influence Coefficient Matrix step 102' of FIGS. 19 and 21, for the purpose of allowing the 'Hydraulic Fracturing Simulator software' 80 of FIGS. 16 and 19 to model or take into account the existence of a 'multi-layer reservoir' (of the type illustrated in FIG. 13), is illustrated. The 'construction of the Set Up Influence Coefficient Matrix step 102' shown in FIGS. 23 and 24, for the purpose of allowing the 'Hydraulic Fracturing Simulator software' 80 to model or take into account the existence of a 'multi-layer reservoir, includes a 'plurality of calculation steps' 102, the 'plurality of calculation steps' 102 being practiced by the 'Set Up Influence Coefficient Matrix' step 102 in FIG. 19 and the 'Generate Elastic Influence Coefficient Matrix for Parent Mesh' step 102 in FIG. 21 when the Influence Coefficient Matrix 108 of FIG. 20 is calculated.

In FIG. 23, the 'construction of the Set Up Influence Coefficient Matrix step 102' of FIGS. 19 and 21, for the purpose of allowing the 'Hydraulic Fracturing Simulator software' 80 of FIGS. 16 and 19 to model or take into account the existence of a 'multi-layer reservoir', includes 'three basic steps' 102a, 102b, and 102c, as follows: (1) Find Spectral Coefficients in Each Layer, step 102a, (2) Perform Exponential Approximation, step 102b, and (3) Assemble an 'Influence Coefficient Matrix' (i.e., matrix 108 of FIG. 20) Using Exponential Expansion Coefficients, step 102c. In step 200, the Influence Coefficient Matrix is sent to a storage device.

The above referenced 'three basic steps' 102a, 102b, and 102c in FIG. 23, adapted for constructing an Influence Coefficient Matrix 108 for the purpose of allowing the 'Hydraulic Fracturing Simulator software' 80 of FIGS. 16 and 19 to model or take into account the existence of a 'multi-layer reservoir', will be discussed in greater detail below with reference to FIG. 24.

In FIG. 24, a detailed construction of each of the 'three basic steps' 102a, 102b, and 102c of FIG. 23 will be discussed.

In FIG. 24, the 'plurality of calculation steps' 102, which are practiced by the 'Set Up Influence Coefficient Matrix' step 102 in FIG. 19 and by the 'Generate Elastic Influence Coefficient Matrix for Parent Mesh' step 102 in FIG. 21 for the purpose of allowing the 'Hydraulic Fracturing Simulator software' 80 of FIGS. 16 and 19 to model or take into account the existence of a 'multi-layer reservoir', include the following steps:

Find Spectral Coefficients in Each Layer, Step 102*a* of FIG. 23:

The 'Find Spectral Coefficients in Each Layer' step 102*a* of FIG. 23 includes the following step (1), as follows:

(1) In order to obtain the stresses and displacements due to a prescribed source [e.g., Displacement Discontinuity (DD) element], determine the spectral coefficients $A_j^l(k)$ by solving a system of algebraic equations (7) and (9) that express the continuity of tractions and displacements across layer interfaces; Equations (7) and (9) will be discussed in detail in the following paragraphs; however, equations (7) and (9) are duplicated below, as follows:

$$\hat{u}_r^l = \sum_j (d_{jr}^l + f_{jr}^l y) e^{\alpha_j^l k y} A_j^l(k) \qquad (7)$$

$$\hat{\sigma}_{pq}^l = \sum_j (s_{jpq}^l + t_{jpq}^l k y) e^{\alpha_j^l k y} A_j^l(k) \qquad (9)$$

Perform Exponential Approximation, Step 102*b* of FIG. 23:

The 'Perform Exponential Approximation' step 102*b* of FIG. 23 includes the following steps (2), (3), and (4), as follows:

(2) Determine the (free space) spectral coefficients $A_j^l(\infty)$ by solving the algebraic equations (7) and (9), set forth above and discussed below, for an infinite homogeneous medium corresponding to the high frequency components associated with the prescribed Displacement Discontinuity (DD); the explicit expressions are identified in FIG. 24 by numeral 102*b*1; where λ and μ are Lame constants:

$$\lambda = \frac{\nu E}{(1+\nu)(1-2\nu)}, \text{ and } \mu = \frac{E}{2(1+\nu)}.$$

(3) Evaluate the low frequency spectral components which are defined by a further expression that is identified in FIG. 24 by numeral 102*b*2;

(4) Approximate these low frequency components $(A_j^l(k))^{LOW}$ by a series of exponential functions by solving for the unknown constants $a_{jr}^l$ and $b_{jr}^l$ in the expansion that is identified in FIG. 24 by numeral 102*b*3.

Assemble Influence Coefficient Matrix Using Exponential Expansion Coefficients, Step 102*c* in FIG. 23:

The 'Assemble Influence Coefficient Matrix Using Exponential Expansion Coefficients' step 102*c* of FIG. 23 includes the following steps (5), (6), and (7), as follows:

(5) Substitute these expansions for the low frequency components into equations (7) and (9) to obtain the expressions for the 'displacement and stress components' that are identified in FIG. 24 by numeral 102*c*1;

(6) Invert the displacements and stresses associated with the low frequency Fourier Transforms by evaluating integrals of the form that is identified in FIG. 24 by numeral 102*c*2, where 'i' is the imaginary number, and 'e' is the exponential operator; and (7) Combine the low frequency displacement and stress components with the infinite space displacements and stresses in the manner which is identified in FIG. 24 by numeral 102*c*3.

Referring to FIGS. 25 through 28, a detailed construction of the 'Set Up Influence Coefficient Matrix' step 102 of FIG. 19 and the 'Generate Elastic Influence Coefficient Matrix for Parent Mesh' step 102 of FIG. 21, for the purpose of allowing the 'Hydraulic Fracturing Simulator software' 80 of FIGS. 16 and 19 to model or take into account the existence of a 'multi-layer reservoir', is set forth in the following paragraphs with reference to FIGS. 25 through 28. Note that step 102 of FIG. 19 is the same step as step 102 in FIG. 21.

The numerical algorithm employed in this invention comprises an efficient technique to determine the local width of a hydraulic fracture due to local pressure applied to the fracture faces by the injection of hydraulic fluid and proppant into the fracture. Further, a method to track the dimensions and width of said fracture as it grows as a function of time is shown. The hydraulic fracture(s) may span any number of layers in a laminated reservoir, with the restriction that all layers must be parallel to each other, as depicted for example in FIG. 23. Layers may be inclined at any angle to the horizontal.

Figure 25:
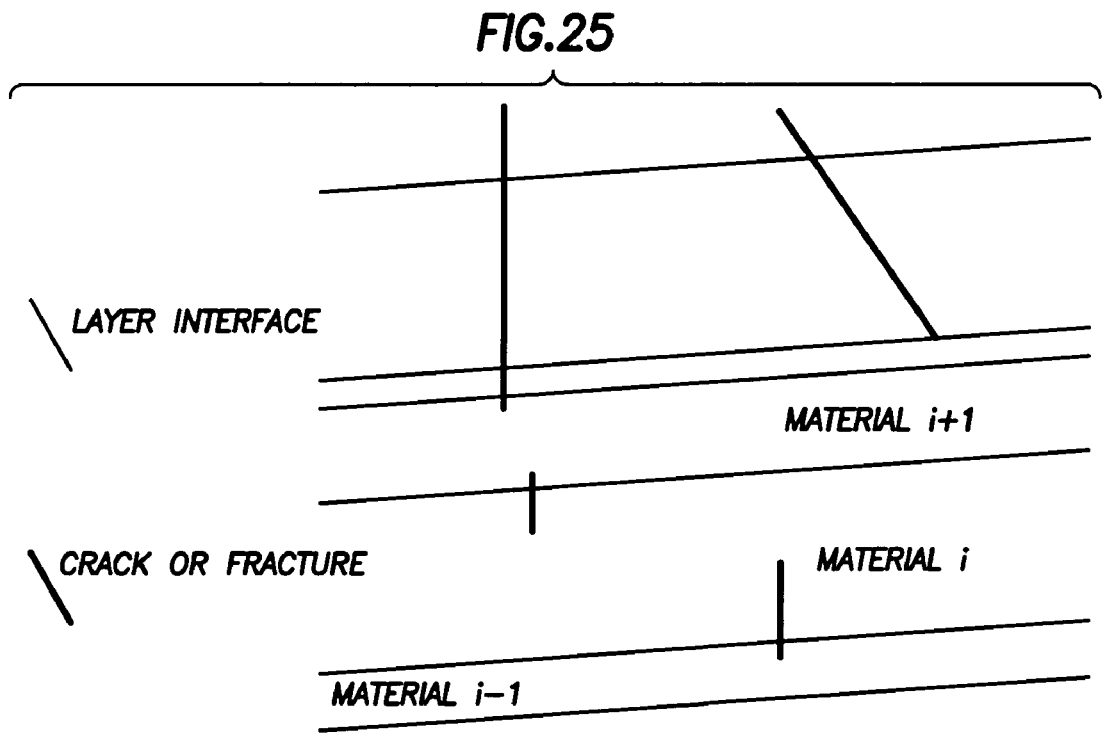
FIGS. 25-28 are used during a discussion of a detailed construction of the 'Set Up Influence Coefficient Matrix [C]' step 102 in FIGS. 19 and 21.
Figure 26:
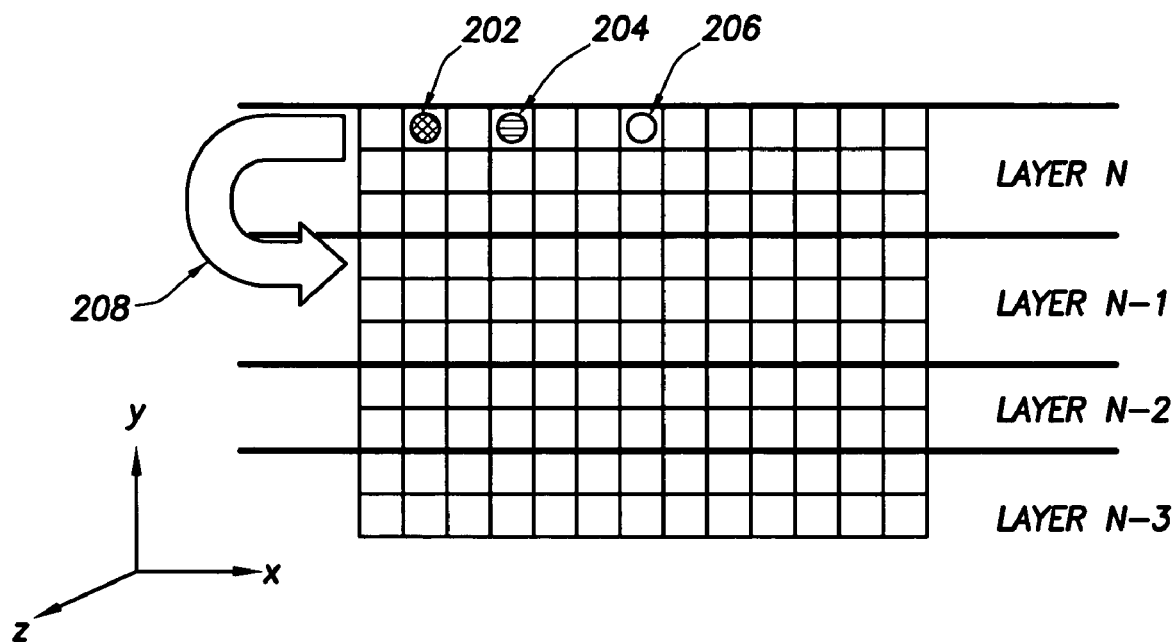

FIG. 25 shows a section through multiple hydraulic fractures in a layered reservoir. The calculation of the fracture width due to the pressure from the injected fluids and proppant mixture is determined by taking into account, accurately and efficiently, the physical properties of each layer comprising the laminated reservoir. The technique used to calculate the relationship between the layered reservoir and the growing hydraulic fracture is based on a well-established numerical technique called the Displacement Discontinuity Boundary Element (hereafter "DD") Method. The method is extended to enable efficient and accurate calculation of the physical effects of layering in the reservoir by the use of a Fourier Transform Method, whereby the relations between stress and strain in the layered reservoir are determined. The numerical method assumes that each hydraulic fracture is divided into a regular mesh of rectangular elements, as depicted in FIG. 26, wherein each numerical element contains its own unique properties. Such properties include applied fluid and proppant pressure, fluid and proppant propagation direction and velocity, local reservoir properties, stress-strain relations, and fracture width.

FIG. 26 shows a numerical mesh of elements subdividing the fracture surface for purposes of calculation. In cases where the numerical element coincides with the fracture edge or tip (see FIG. 27), certain additional information is uniquely defined for such elements. For example, such information may include the local velocity of propagation of the fracture tip, the special relationship between the fluid in the fracture and the surrounding layered reservoir, and how the fluid and reservoir physically interact with each other. This interaction is accounted for by means of special properties assigned to the tip elements, comprising the interaction between a fluid-filled fracture and the host material it is fracturing.

Figure 27:
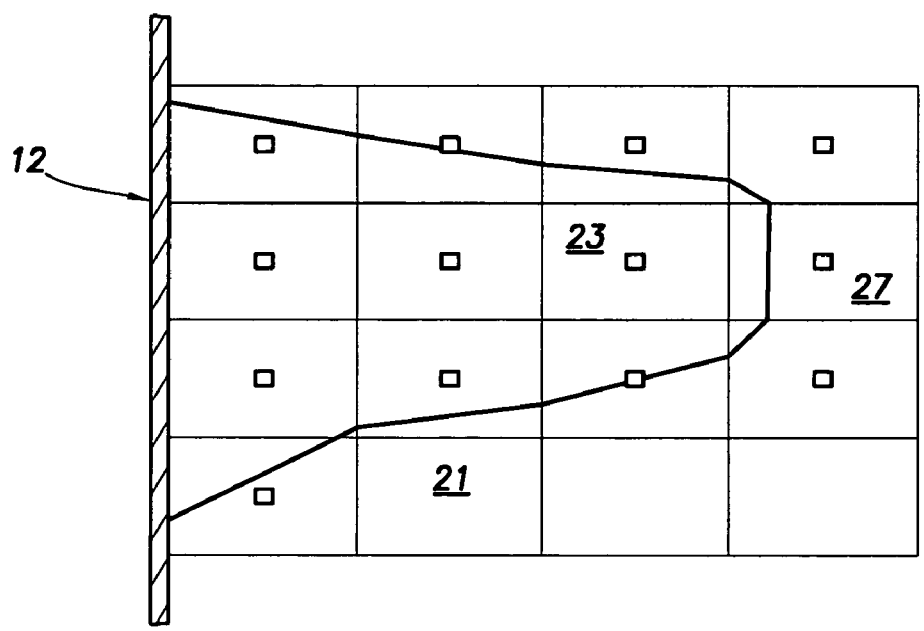

FIG. 27 reveals a fracture outline on a numerical mesh. Each numerical element depicted in FIG. 26 or 27 relates to every other element in the numerical mesh by means of special mathematical relationships. We refer to elements as: (1) sending or source elements, and (2) receiver elements. A source element sends a signal representing a mathematical relationship to a receiver element. The signal is the net pressure, which is equal to the fluid pressure (p) 110 minus the confining stress ($\sigma_c$) 112 as indicated by the multi-layer elasticity equation 104 in FIG. 20, in that portion of the fracture. The receiver signal comprises the stress and strain experienced at the receiver location due to the applied pressure at the source element location. Many of these signals between source and receiver element are duplicated in the numerical mesh, and in these cases, special algorithms are designed to dramatically minimize the volume of storage required, so that only unique signals between different elements need to be stored.

The signals between each unique pair of receiver and source elements are stored in the computer memory or on a physical storage device in a matrix. The hydraulic fracture propagation numerical method is designed so that the fracture propagates in a finite number of time steps. At each time step, the signal matrix is invoked, extracting those signals which are active over the part of the numerical mesh that is covered by the current configuration of the hydraulic fracture. This matrix is then used to build a system of numerical equations that are solved for the fracture width at the current time—at each active element location.

During each fracture propagation step, another matrix of signals is constructed, the matrix comprising the physical behavior of the fluid in the hydraulic fracture, which relates the local fluid pressure to the local fracture width. This system of equations is also solved iteratively for local fluid pressures at each time step.

The combined system of equations must be coupled together in an efficient manner, so that they feed off each other until a balanced solution of fluid pressure and fracture width is obtained at each time step. This coupling between the two equation systems is accomplished by means of a special numerical algorithm that efficiently and accurately ensures that the correct solution is obtained. The entire system is designed to ensure that no fluid or proppant is unaccounted for in any time step.

The above process is repeated at each time step, thereby allowing the calculation of the way in which the fracture grows as a function of time. At each time step, the algorithm predicts which elements are active (i.e., filled with fluid and proppant), and the fracture width and fracture pressure on each active element. A complete description of the process of the propagation of a hydraulic fracture is thus obtained.

Solutions of the multi-layer equilibrium equations are provided.

In the following, we assume a three-dimensional body, so subscripts range from 1 to 3. The theory also applies to the two-dimensional cases (plane strain, plane stress, antiplane strain). The method provides an efficient way of determining the solution to the equilibrium equations:

$$\sigma_{ij,j}^l + b_i^l = 0 \qquad (1)$$

for an, in general, transversely isotropic elastic layered medium, where superscript l indicates the layer number, with a stress-strain relationship given by:

$$\sigma_{ij}^l = C_{ijkr}^l \epsilon_{kr}^l \qquad (2)$$

In the case of a transversely isotropic three-dimensional elastic medium, there are five independent material constants. The strain components in (2) are given by $$\epsilon_{kr}^l = \frac{1}{2}(u_{k,r}^l + u_{r,k}^l) \qquad (3)$$

For a medium comprising multiple parallel layers each of which is homogeneous (see FIG. 28), it is possible to obtain a solution to the governing equations (1)-(3) by means of the Fourier Transform.

Figure 28:
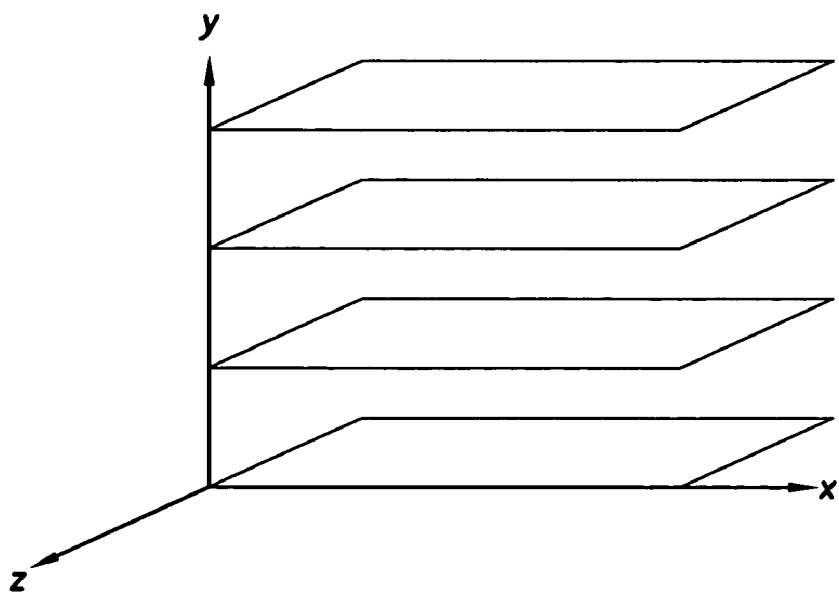

Refer now to FIG. 28 representing a schematic showing multiple parallel layers in a three dimensional case.

By substituting (3) and (2) into (1) and by taking the two-dimensional Fourier Transform with respect to x and z (where subscripts 1=x, 2=y, 3=z):

$$\hat{u}_j^l(m, n, y) = \int_{-\infty}^{\infty}\int_{-\infty}^{\infty} e^{i(mx+nz)} u_j^l(x, y, z) dx dz \qquad (4)$$

of the resulting equilibrium equations in terms of the displacements, we obtain a system of ordinary differential equations in the independent variable y. This system of ordinary differential equations determines the Fourier Transforms of displacement components $u_x^l$, $u_y^l$, and $u_z^l$:

$$L(C_{ijkr}^l)\begin{bmatrix} \hat{u}_x \\ \hat{u}_y \\ \hat{u}_z \end{bmatrix}^l = \begin{bmatrix} \hat{b}_x \\ \hat{b}_y \\ \hat{b}_z \end{bmatrix}^l \qquad (5)$$

For a layered material, there is a system of differential equations of the form (5) for each layer, each of whose coefficients is determined by the material properties of the layer. It is possible to solve the system of differential equations for a typical layer l to obtain the general solution to the r th displacement components in the form:

$$\hat{u}_r^l = \sum_j d_{jr}^l e^{\alpha_j^l k y} A_j^l(k) \text{ where } k = \sqrt{m^2 + n^2} \qquad (6)$$

In the case of repeated roots of the characteristic equation associated with (5), which occurs for the important case of isotropic layers, the system (5) has the general solution:

$$\hat{u}_r^l = \sum_j (d_{jr}^l + f_{jr}^l y) e^{\alpha_j^l k y} A_j^l(k) \qquad (7)$$

Here $d_{jr}^l$ and $f_{jr}^l$ are constants that depend on the material constants of the layer, the $\alpha_j^l$ are the roots of the characteristic equation for the system of ordinary differential equations, and the $A_j^l(k)$ are free parameters of the solution that are determined by the forcing terms $b_i^l$ in (1) and the interface conditions prescribed at the boundary between each of the layers (e.g., bonded, frictionless, etc.).

Substituting these displacement components into the stress strain law (2), we can obtain the corresponding stress components: $\hat{\sigma}_{xx}^l$, $\hat{\sigma}_{yy}^l$, $\hat{\sigma}_{zz}^l$, $\hat{\sigma}_{xy}^l$, $\hat{\sigma}_{xz}^l$, and $\hat{\sigma}_{yz}^l$, which can be expressed in the form:

$$\hat{\sigma}_{pq}^l = \sum_j (s_{jpq}^l) e^{\alpha_j^l k y} A_j^l(k) \qquad (8)$$

In the case of repeated roots the stress components assume the form:

$$\hat{\sigma}_{pq}^l = \sum_j (s_{jpq}^l + t_{jpq}^l ky) e^{\alpha_j^l ky} A_j^l(k) \qquad (9)$$

For each layer and for each sending DD element located at a particular y coordinate, there are a set of six parameters $A_j^l(k)$ that need to be determined from a system of algebraic equations that express the required body forces and boundary conditions in the model. Once the $A_j^l(k)$ have been determined, it is possible to calculate the influences of any DD having the same y component on any receiving point in any layer by taking the inverse Fourier Transform:

$$u_j^l = \frac{1}{(2\pi)^2} \int_{-\infty}^{\infty}\int_{-\infty}^{\infty} e^{-i(mx+nz)} \hat{u}_j^l dm\,dn \qquad (10)$$

of equations (6)-(9).

One of the major computational bottlenecks in the procedure outlined above is the inversion process represented by (10), which involves the numerical inversion of a two-dimensional Fourier Transform for each sending-receiving pair of DD elements. The scheme we propose uses an exponential approximation of the spectral solution coefficients $A_j^l(k)$ (see for example reference [11], which was constructed only for point sources in layered dielectric materials, or reference [12]—only for horizontal conducting elements in layered dielectric materials) of the form:

$$A_j^l(k) - A_j^l(\infty) \approx \sum_r a_{jr}^l e^{b_{jr}^l k} \qquad (11)$$

Here $A_j^l(\infty)$ represents the "high frequency" components of the spectrum of the solution, which represents the singular part of the solution in real space.

The inversion process can be achieved by evaluating integrals of the form:

$$I_j^{pl} = \frac{1}{(2\pi)^2} \int_{-\infty}^{\infty}\int_{-\infty}^{\infty} [A_j^l(k) - A_j^l(\infty)] k^p e^{\alpha_j^l ky} e^{-i(mx+nz)} dm\,dn \qquad (12)$$

or $$I_j^{pl} \approx \frac{1}{(2\pi)^2} \sum_j a_{jr}^l \int_{-\infty}^{\infty}\int_{-\infty}^{\infty} k^p e^{k(\alpha_j^l y + b_{jr}^l)} e^{-i(mx+nz)} dm\,dn$$

which can be evaluated in a closed form. The shifted components $\alpha_j^l y + b_{jr}^l$ in (12) represent a finite number of complex images that approximate what would be an L-fold infinite Fourier Series (for L layers) that would be required to represent the Green's function in a closed form using the method of images. Typically three or four complex images suffice to give a high order of accuracy.

The expressions of the form (12) are not much more complicated than the pair-wise DD influences that apply for a homogeneous elastic medium. The only difference in this case is that for each sending DD element, the expansion coefficients $a_{jr}^l$ and $b_{jr}^l$ for each layer need to be determined by solving the appropriate set of algebraic equations and performing the exponential fit (11) of these coefficients. Once these coefficients have been determined we have a very efficient procedure to determine the influences between DD elements.

Refer now to FIG. 26 representing a Schematic showing a duplicity of influence coefficients for a multiple layer problem.

In FIG. 26, for a regular array of DD elements there is an additional saving that can be exploited. In this case only the influence of a single sending DD element at each horizon (i.e., y level) needs to be determined in order to determine the whole influence matrix. For example, the DD elements in layer N denoted by the solid circle 202, the shaded circle 204, the unshaded circle 206, and the arrow 208, in FIG. 26, each have the same set of exponential expansion coefficients $a_{jr}^l$ and $b_{jr}^l$ in layer N-1, where the arrow 208 indicates where the expansion coefficients $a_{jr}^l$ and $b_{jr}^l$ are identical.

A DD influence at a specified point within a given layer is constructed by constructing a pseudo interface parallel to the layering across which there can be a jump in the displacement field. To construct a normal DD a jump in $u_y$ is specified, whereas to construct a shear or ride DD a jump in $u_x$ or $u_z$ is specified. This technique limits the orientation of DD components to be aligned with the pseudo interface that is parallel to the layering.

However, it is desirable to have DD components that specify jumps in the displacement field which are across interfaces that are not parallel to the layering in the material. In particular, for hydraulic fracturing problems in the petroleum industry, it is important to be able to model vertical fracture planes that are perpendicular to the horizontally layered material. In this case, and for arbitrarily oriented DDs, it is possible to construct a DD field of a desired orientation, by utilizing the duality relationship between the stresses due to a force discontinuity (or point force) and the displacements due to a displacement discontinuity. The solution to a force discontinuity in the r th direction can be constructed by taking $b_r = \delta(x, y, z) F_r$, where $\delta(x, y, z)$ represents the Dirac delta function.

Having obtained the stresses due to a force discontinuity:

$$\hat{\sigma}_{ij} = \hat{\gamma}_{ijr} F_r \qquad (13)$$

it is possible to determine the displacements due to a DD according to the following duality relation:

$$\hat{u}_r = \hat{\gamma}_{ijr} D_{ij} \qquad (14)$$

The key idea here is to construct a planar Green's function or influence matrix, which represents the influences of all the DDs that lie in a vertical fracture plane. The influence matrix will only represent the mutual influences on one another of DDs that lie in the fracture plane. However, it will implicitly contain the information about the variations in material properties due to the layering.

A reduced influence matrix can be constructed by any numerical method, including that proposed above, which can represent rigorously the changes in material properties between the layers, for example the finite element method or a boundary integral method in which elements are placed on the interfaces between material layers. The in-plane influence coefficients would be calculated by means of the following procedure.

To calculate the influence of the ij th in-plane DD on the kl th DD anywhere else on the fracture plane, the value of the ij th DD would be assigned a value of unity and all the other fracture plane DDs would be set equal to zero. The boundary integral or finite element solution on the interfaces between the material layers would then be determined so as to ensure that there is compatibility in the displacements between the material layers as well as a balance in the forces between the layers at the interface. Once numerical solution has been calculated for the whole problem, the corresponding stresses on each of the in-plane DD elements can be evaluated to determine the in-plane stress influence of that unit DD on all the other DDs in the fracture plane. By repeating this process for each of the DDs that lie in the fracture plane, it is possible to determine the in-plane influence matrix which represents the effect that each DD in the plane has on any of the other in-plane DDs. By allowing the interface solution values to react to the sending DD element, the effect of the layers has been incorporated implicitly into this abbreviated set of influence coefficients.

The numerical procedure outlined to construct the desired in-plane influence matrix would take a considerable amount of time to compute. Indeed, such a process would likely exclude the possibility of real time processing with current personal computers or workstations, but could conceivably be performed in a batch mode prior to the desired simulation being performed. The semi-analytic method outlined above would be much more efficient, as the fully three-dimensional (or two-dimensional, in the case of plane strain or plane stress), problem that needs to be solved to calculate the influence of each DD element has been effectively reduced to a one-dimensional one.

Numerical models for multi-layered materials require that the interface between each material type is numerically "stitched" together by means of elements. For example, a boundary element method implementation would require that each interface between different material types is discretized into elements. A finite element or finite difference method implementation would require that the entire domain is discretized into elements. In the inventive method, the material interfaces are indirectly taken into account without the requirement of explicitly including elements away from the surface of the crack or fracture. The implication thereof, is a dramatic reduction in the number of equations to be solved, with a commensurate dramatic decrease in computer processing time. In addition, accuracy of the solution is maintained. One aspect of this invention which distinguishes it from previous work is that it is capable of solving problems in multi-layered elastic materials with arbitrarily inclined multiple cracks or fractures in two or three-dimensional space.

In this specification, note that 'elements' can intersect layers. This is accomplished by taking special care of the mathematical stress/strain relationships across interfaces in such a way as to obtain the correct physical response for the element which is located across the interface(s).

References 1-3 below are classic papers that establish the Fourier scheme to solve elastic multi-layer problems, but do not utilize the inversion scheme proposed here. In references 1 and 2, a propagator matrix approach is suggested to solve the system of algebraic equations necessary for the Fourier scheme, but this particular scheme will become unstable for problems with many layers.

References 4 and 5 use exponential approximation for inversion. The methods in those references do not give rise to the complex images generated by the algorithm presented in this invention that so efficiently represent the effect of many layers. Reference 5 extends the propagator approach used in references 1 and 2 to solve the algebraic equations of the Fourier method. Reference 5 discloses an inversion scheme that is an integral part of the propagator method. This method involves an exponential approximation, similar to that proposed in this patent, but it is applied to only one part of the propagator equations. As a result, a least squares fit of many terms (more than 50) is required to yield reasonable results using the teachings of this reference. Apart from stability issues involved with exponential fitting, the large number of terms would probably be less efficient than using direct numerical integration for inversion. The exponential fit of the spectral coefficients that we propose involves less than five terms.

References 6 through 10 extend the Fourier method to transversely isotropic media. References 7-10 use the propagator matrix for solving the algebraic equations, while reference 6 proposes direct solution. All these methods of solution would be numerically unstable for problems with many thick layers. While reference 10 proposes numerical inversion using continued fractions, little mention is made of the inversion process.

References 11 and 12 describe methodologies for multi-layer dielectric materials containing point electrical charges, or line charge distributions aligned parallel to interfaces (i.e., with different Green's functions to those used in elasticity).

Reference 13 describes a so-called "sweeping" algorithm to solve layered systems. The method disclosed in reference 13 is essentially the classic block LU decomposition for a block tri-diagonal system. In this specification, we use this algorithm to obtain a stable solution of the algebraic equations that determine the Fourier spectral coefficients in each of the layers. This method is particularly effective for problems in which the layers are thick or the wave-numbers are large.

It is recognized that other mathematical relationships may be used in the invention to achieve the same commercial or physical purpose. While not employing exactly the same equations, such methods are within the scope of the invention set forth in this specification.

The following references (i.e., references 1 through 15) are incorporated herein by reference:

1. Ben-Menahem, A. and Singh, S. J. 1968. *Multipolar elastic fields in a layered half space*. Bull. Seism. Soc. Am. 58(5). 1,519-72.
2. Singh, S. J. 1970. *Static deformation of a multi-layered half-space by internal sources*. J. Geophys. Res. 75(17). 3,257-63.
3. Chen, W. T. 1971. *Computation of stresses and displacements in a layered elastic medium*. Int. J. Engng. Sci. vol. 9. 775-800.
4. Sato, R. and Matsu'ura, M. 1973. *Static deformations due to the fault spreading over several layers in a multi-layered medium Part I: Displacement*. J. Phys. Earth. 21. 227-249.
5. Jovanovich, D. B., Husseini, M. I. and Chinnery, M. A. 1974. *Elastic dislocations in a layered half-space—I. Basic theory and numerical methods*. Geophys. Jour. Roy. Astro. Soc. 39. 205-217.
6. Wardle, L. J. 1980. *Stress analysis of multilayered anisotropic elastic systems subject to rectangular loads*. CSIRO Aust. Div. Appl. Geomech. Tech. paper no. 33. 1-37.
7. Singh, S. J. 1986. *Static deformation of a transversely isotropic multilayered half-space by surface loads*. Physics of the Earth and Planetary Interiors. 42. 263-273.
8. Pan, E. 1989. *Static response of a transversely isotropic and layered half-space to general surface loads*. Physics of the Earth and Planetary Interiors. 54. 353-363.
9. Pan, E. 1989. *Static response of a transversely isotropic and layered half-space to general dislocation sources*. Physics of the Earth and Planetary Interiors. 58. 103-117.
10. Pan, E. 1997. *Static Green's functions in multilayered half spaces*. Appl. Math. Modeling. 21. 509-521.

11. Chow, Y. L., Yang, J. J., and Howard, G. E. 1991. *Complex images for electrostatic field computation in multilayered media.* IEEE Trans. on Microwave Theory and Techniques. vol. 39. no. 7. 1120-25.
12. Crampagne, R., Ahmadpanah, M. and Guiraud, J.-L. 1978. *A simple method for determining the Green's function for a class of MIC lines having multilayered dielectric structures.* IEEE Trans. on Microwave Theory and Techniques. vol. MTT-26. No. 2. 82-87.
13. Linkov, A. M., Linkova, A. A., and Savitski, A. A. 1994. *An effective method for multi-layered media with cracks and cavities.* Int. J. of Damage Mech. 3. 338-35.
14. Ryder, J. A., and Napier, J. A. L. 1985. *Error Analysis and Design of a Large Scale Tabular Mining Stress Analyzer.* Proceedings of the Fifth International Conference on Numerical Methods in Geomechanics, Nagoya, Japan, [Balkema] 1549-1555.
15. J. A. Ryder, Eds.: E. G. Beer, J. R. Booker, and J. P. Carter, *Optimal Iteration Schemes Suitable for General Non-linear Boundary Element Modeling Applications*: Proceedings of the 7th International Conference on Computer Methods and Advances in Geomechanics, Cairns, Australia [Balkema], 1991.

The above description of the 'Hydraulic Fracturing Simulator Software' being thus described, it will be obvious that the same may be varied in many ways. Such variations are not to be regarded as a departure from the spirit and scope of the claimed method or apparatus or program storage device, and all such modifications as would be obvious to one skilled in the art are intended to be included within the scope of the following claims.

We claim:

1. A program storage device readable by a machine tangibly embodying a program of instructions executable by the machine to perform method steps comprising:
    simulating a hydraulic fracture in an Earth formation where the formation includes a multilayered reservoir;
    calculating a mesh overlaying the fracture thereby defining a plurality of elements;
    calculating and determining an influence coefficient matrix, the matrix having a plurality of numbers, wherein each of the plurality of elements corresponds to at least one of the plurality of numbers, and wherein the plurality of numbers corresponds to a plurality of layers of the multilayered reservoir, wherein the calculating and determining an influence coefficient matrix comprises finding spectral coefficients in each layer of the multilayered reservoir, performing an exponential approximation, and assembling an influence coefficient matrix using exponential expansion coefficients, and wherein the finding spectral coefficients comprises determining the spectral coefficients by solving a system of algebraic equations that express the continuity of tractions and displacements across layer interfaces;
    providing output data in response to the simulated hydraulic fracture to at least one of a display device and a recorder; and
    wherein the system of algebraic equations comprise:

$$\hat{u}_r^l = \sum_j (d_{jr}^l + f_{jr}^l y) e^{\alpha_j^l k y} A_j^l(k), \text{ and}$$

$$\hat{\sigma}_{pq}^l = \sum_j (s_{jpq}^l + t_{jpq}^l k y) e^{\alpha_j^l k y} A_j^l(k),$$

wherein $\hat{u}_r^l$ defines the rth displacement component for the layer l, wherein p and q define stress tensor indicia, wherein $\hat{\sigma}_{pq}^l$ defines a stress component for layer l in the direction pq, wherein $A_j^l(k)$ defines the spectral coefficient for column vector value j of the layer l, wherein y defines a spatial coordinate, wherein k defines a wave number in the Fourier-transform (FT) domain, wherein s and t define layer-dependent stress-related material property constants, wherein d and f define layer-dependent material property constants, and wherein $\alpha_j^l k y$ defines a root of the characteristic equation for a system of ordinary differential equations (ODEs) relating directional stress to directional force for a layer.

2. The program storage device of claim 1, wherein the performing an exponential approximation comprises determining a set of free space spectral coefficients by solving the system of algebraic equations for an infinite homogeneous medium corresponding to a set of high frequency components associated with a prescribed displacement discontinuity, and evaluating a set of low frequency spectral components defined by $$(A_j^l(k))^{LOW} = A_j^l(k) - A_j^l(\infty), \text{ and}$$

approximating said low frequency spectral components by a series of exponential functions by solving for unknown constants $a_{jr}^l$ and $b_{jr}^l$ in the following expansion:

$$(A_j^l(k))^{LOW} \approx \sum a_{jr}^l e^{b_{jr}^l k},$$

wherein $(A_j^l(k))^{LOW}$ defines the low frequency spectral coefficient for column vector value j of layer l, wherein $A_j^l(\infty)$ defines the high frequency spectral coefficient for column vector value j of layer l, and wherein $a_{jr}^l$ and $b_{jr}^l$ comprise exponential expansion coefficients for layer l.

3. The program storage device of claim 1, wherein the assembling an influence coefficient matrix using exponential expansion coefficients comprises:
    substituting a set of expansions representing said low frequency spectral components into the system of algebraic equations to obtain a set of expressions for displacement and stress components, the set of expressions including, $$\hat{u}_p^l(k,y) = \sum_j s_{jp} \sum_r a_{jr}^l e^{(\alpha_j^l + b_{jr}^l)k}, \text{ and}$$

$$\hat{\sigma}_{pq}^l(k,y) = \sum_j s_{jpq} \sum_r a_{jr}^l e^{(\alpha_j^l y + b_{jr}^l)k},$$

inverting the displacement and stress components associated with the low frequency spectral components in connection with a set of Fourier Transforms by evaluating integrals of the form, $$I_j^{pwl} \approx \frac{1}{(2\pi)^2} \sum_r a_{jr}^l \int_{-\infty}^{\infty} \int_{-\infty}^{\infty} k^{pw} e^{k(\alpha_j^l y + b_{jr}^l)} e^{-i(mx+nz)} dm dn, \text{ and}$$

combining the low frequency displacement and stress components with the infinite space displacements and stresses as follows $$u_i^l = (u_i^l)^{LOW} + (u_i^l)^{\infty} \text{ and } \sigma_{ij}^l = (\sigma_{ij}^l)^{LOW} + (\sigma_{ij}^l)^{\infty},$$

wherein $I_j^{pl}$ defines an integral equation for a power term $p_w$ of layer l, wherein $u_i^l$ defines the ith displacement component for the layer l, wherein $(u_i^l)^{LOW}$ defines the ith low frequency displacement component for the layer l, wherein $(u_i^l)^\infty$ defines the ith high frequency, displacement component for the layer l, wherein $\sigma_{ij}^l$ defines the ith stress component for the layer l, wherein $(\sigma_{ij}^l)^{LOW}$ defines the ith low frequency stress component for the layer l, wherein $(\sigma_{ij}^l)^\infty$ defines the ith high frequency stress component for the layer l, and wherein m and n define wave number pairs in the FT domain, and wherein x and z comprise spatial coordinates.

4. The program storage device of claim 1, wherein the method steps further comprise:
setting a time step to be a first time step;
in the first time step, iteratively calculating a fracture width in each element given a fluid pressure in said each element and iteratively calculating a fluid pressure in each element given a fracture width in each element until convergence occurs;
updating a fracture footprint in response to the iteratively calculating the fracture width;
updating the time step to a next time step;
repeating the setting a time step, the updating a fracture footprint, and the updating the time step until the time step reaches a maximum allowed time; and
generating the output data representing a fracture width and a fluid pressure in each element of the plurality of elements of the mesh.

5. A method comprising:
simulating using a processor a hydraulic fracture in an Earth formation where the formation includes a multi-layered reservoir;
calculating a mesh overlaying the fracture thereby defining a plurality of elements;
calculating and determining an influence coefficient matrix, the matrix having a plurality of numbers, wherein each of the plurality of elements corresponds to at least one of the plurality of numbers, and wherein the plurality of numbers corresponds to a plurality of layers of the multilayered reservoir, wherein the calculating and determining an influence coefficient matrix comprises finding spectral coefficients in each layer of the multilayered reservoir, performing an exponential approximation, and assembling an influence coefficient matrix using exponential expansion coefficients, and wherein the finding spectral coefficients comprises determining the spectral coefficients by solving a system of algebraic equations that express the continuity of tractions and displacements across layer interfaces;
providing output data in response to the simulated hydraulic fracture to at least one of a display device and a recorder; and
wherein the system of algebraic equations comprise:

$$\hat{u}_r^l = \sum_j (d_{jr}^l + f_{jr}^l y) e^{\alpha_j^l k y} A_j^l(k), \text{ and}$$

$$\hat{\sigma}_{pq}^l = \sum_j (s_{jpq}^l + t_{jpq}^l k y) e^{\alpha_j^l k y} A_j^l(k),$$

wherein $\hat{u}_r^l$ defines the rth displacement component for the layer l, wherein p and q define stress tensor indicia, wherein $\hat{\sigma}_{pq}^l$ defines a stress component for layer l in the direction pq, wherein $A_j^l(k)$ defines the spectral coefficient for column vector value j of the layer l, wherein y defines a spatial coordinate, wherein k defines a wave number in the Fourier-transform (FT) domain, wherein s and t define layer-dependent stress-related material property constants, wherein d and f define layer-dependent material property constants, and wherein $\alpha_j^l k y$ defines a root of the characteristic equation for a system of ordinary differential equations (ODEs) relating directional stress to directional force for a layer.

6. The method of claim 5, wherein the performing an exponential approximation comprises determining a set of free space spectral coefficients by solving the system of algebraic equations for an infinite homogeneous medium corresponding to a set of high frequency components associated with a prescribed displacement discontinuity, evaluating a set of low frequency spectral components defined by $$(A_j^l(k))^{LOW} = A_j^l(k) - A_j^l(\infty), \text{ and}$$

approximating the low frequency spectral components by a series of exponential functions by solving for unknown constants $a_{jr}^l$ and $b_{jr}^l$ in the following expansion:

$$(A_j^l(k))^{LOW} \approx \sum_r a_{jr}^l e^{b_{jr}^l k},$$

wherein $(A_j^l(k))^{LOW}$ defines the low frequency spectral coefficient for column vector value j of layer l, wherein $A_j^l(\infty)$ defines the high frequency spectral coefficient for column vector value j of layer l, and wherein $a_{jr}^l$ and $b_{jr}^l$ comprise exponential expansion coefficients for layer l.

7. The method of claim 5, wherein the assembling an influence coefficient matrix using exponential expansion coefficients comprises substituting a set of expansions representing the low frequency spectral components into the system of algebraic equations to obtain a set of expressions for displacement and stress components, the set of expressions including $$\hat{u}_p^l(k, y) = \sum_j s_{jp} \sum_r a_{jr}^l e^{(\alpha_j^l y + b_{jr}^l) k}, \text{ and}$$

$$\hat{\sigma}_{pq}^l(k, y) = \sum_j s_{jpq} \sum_r a_{jr}^l e^{(\alpha_j^l y + b_{jr}^l) k},$$

inverting the displacement and stress components associated with the low frequency spectral components in connection with a set of Fourier Transforms by evaluating integrals of the form, $$I_j^{p_w l} \approx \frac{1}{(2\pi)^2} \sum_r a_{jr}^l \int_{-\infty}^\infty \int_{-\infty}^\infty k^{p_w} e^{k(\alpha_j^l y + b_{jr}^l)} e^{-i(mx+nz)} dm dn, \text{ and}$$

combining the low frequency displacement and stress components with the infinite space displacements and stresses as follows $$u_i^l = (u_i^l)^{LOW} + (u_i^l)^\infty \text{ and } \sigma_{ij}^l = (\sigma_{ij}^l)^{LOW} + (\sigma_{ij}^l)^\infty,$$

wherein $I_j^{pl}$ defines an integral equation for a power term $P_w$ of layer l, wherein $u_i^l$ defines the ith displacement component for the layer l, wherein $(u_i^l)^{LOW}$ defines the ith low frequency displacement component for the layer l, wherein $(u_i^l)^\infty$ defines the ith high frequency, displacement component for the layer l, wherein $\sigma_{ij}^l$ defines the ith stress component for the layer l, wherein $(\sigma_{ij}^l)^{LOW}$ defines the ith low frequency stress component for the layer l, wherein $(\sigma_{ij}^l)^\infty$ defines the ith high frequency stress component for the layer l, and wherein m and n define wave number pairs in the FT domain, and wherein x and z comprise spatial coordinates.

8. The method of claim 5, wherein the method steps further comprise:

setting a time step to be a first time step;

in the first time step, iteratively calculating a fracture width in each element given a fluid pressure in said each element and iteratively calculating a fluid pressure in each element given a fracture width in each element until convergence occurs;

updating a fracture footprint in response to the iteratively calculating the fracture width;

updating the time step to a next time step;

repeating the setting a time step, the updating a fracture footprint, and the updating the time step until the time step reaches a maximum allowed time; and generating the output data representing a fracture width and a fluid pressure in each element of the plurality of elements of the mesh.

9. The method of claim 1, further comprising changing an injection schedule in response to the output data.

10. The method of claim 5, further comprising changing an injection schedule in response to the output data.

* * * * *